(12) United States Patent
Sakuma et al.

(10) Patent No.: US 7,728,435 B2
(45) Date of Patent: Jun. 1, 2010

(54) SEMICONDUCTOR DEVICE WITH DOUBLE BARRIER FILM

(75) Inventors: Makoto Sakuma, Yokohama (JP); Yasuhiko Matsunaga, Yokohama (JP); Fumitaka Arai, Yokohama (JP); Kikuko Sugimae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/143,597

(22) Filed: Jun. 20, 2008

(65) Prior Publication Data
US 2008/0251881 A1 Oct. 16, 2008

Related U.S. Application Data

(60) Continuation of application No. 11/980,561, filed on Oct. 31, 2007, now abandoned, which is a continuation of application No. 11/447,947, filed on Jun. 7, 2006, now Pat. No. 7,291,875, which is a division of application No. 11/001,223, filed on Dec. 2, 2004, now Pat. No. 7,078,813.

(30) Foreign Application Priority Data

Sep. 28, 2004 (JP) ............................. 2004-282336

(51) Int. Cl.
*H01L 23/485* (2006.01)
(52) U.S. Cl. .................. 257/758; 257/211; 257/700; 257/774; 257/208; 257/E23.019
(58) Field of Classification Search ................. 257/758, 257/774, 208, 211, E23.011, E23.019
See application file for complete search history.

(56) References Cited

U.S. PATENT DOCUMENTS

| | | | |
|---|---|---|---|
| 6,150,281 A | 11/2000 | Kwean | |
| 6,265,780 B1 | 7/2001 | Yew et al. | |
| 6,271,125 B1 | 8/2001 | Yoo et al. | |
| 6,291,335 B1 | 9/2001 | Schnabel et al. | |
| 6,376,351 B1 * | 4/2002 | Tsai | 438/592 |
| 6,424,044 B1 | 7/2002 | Han et al. | |
| 6,461,911 B2 | 10/2002 | Ahn et al. | |
| 6,501,115 B2 * | 12/2002 | Yoshida et al. | 257/296 |
| 6,680,248 B2 | 1/2004 | Huang et al. | |

(Continued)

FOREIGN PATENT DOCUMENTS

JP 2002-118166 4/2002

(Continued)

*Primary Examiner*—Victor A Mandala
(74) *Attorney, Agent, or Firm*—Oblon, Spivak, McClelland, Maier & Neustadt, L.L.P.

(57) ABSTRACT

A semiconductor device comprising a first insulation layer, a second insulation layer, a first barrier film, a second barrier film, a diffusion layer. The device further comprises an upper contact hole, a lower contact hole, and a contact plug. The upper contact hole penetrates the second insulation layer and has a bottom in the second barrier film. The bottom has a width greater than a trench made in the first insulation layer, as measured in a direction crossing the widthwise direction of the trench. The lower contact hole penetrates the first insulation layer and first barrier film, communicates with the first contact hole via the trench and is provided on the diffusion layer. The upper portion of the lower contact hole has the same width as the trench. The contact plug is provided in the upper contact hole and lower contact hole.

22 Claims, 20 Drawing Sheets

U.S. PATENT DOCUMENTS

| | | |
|---|---|---|
| 6,720,612 B2 | 4/2004 | Takeuchi et al. |
| 6,894,341 B2 | 5/2005 | Sugimae et al. |
| 6,953,965 B2 * | 10/2005 | Goda et al. ................ 257/316 |
| 6,960,492 B1 * | 11/2005 | Miyamoto ................ 438/109 |
| 7,163,886 B2 | 1/2007 | Fujiwara et al. |
| 7,195,970 B2 | 3/2007 | Tu et al. |
| 7,291,875 B2 | 11/2007 | Sakuma et al. |
| 2004/0133190 A1 | 7/2004 | Hobart et al. |
| 2006/0038218 A1 | 2/2006 | Yaegashi et al. |
| 2007/0120166 A1 | 5/2007 | Arai et al. |
| 2007/0138575 A1 | 6/2007 | Arai et al. |

* cited by examiner

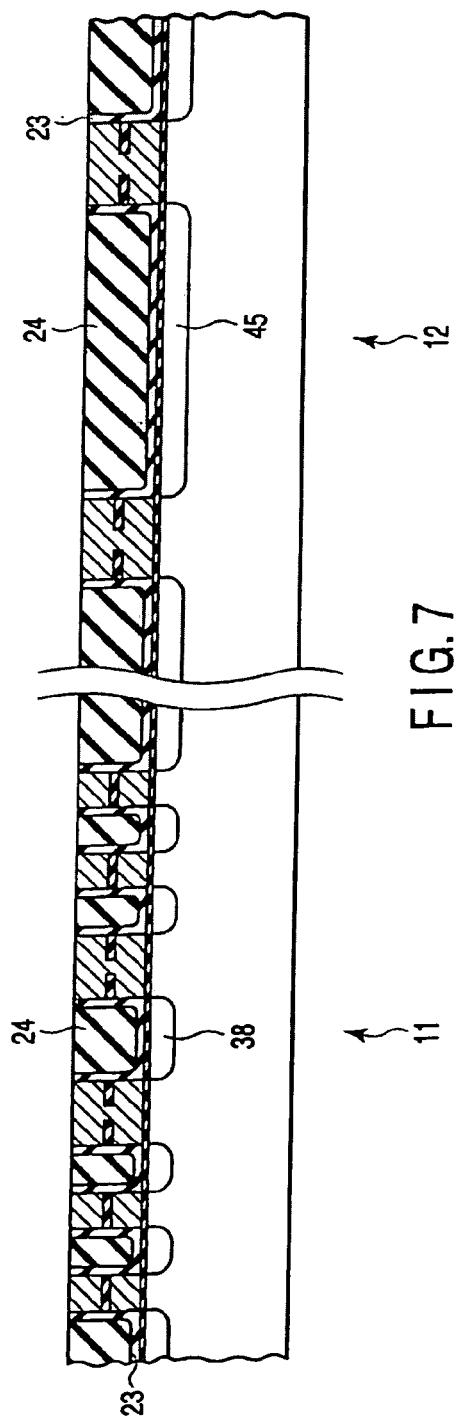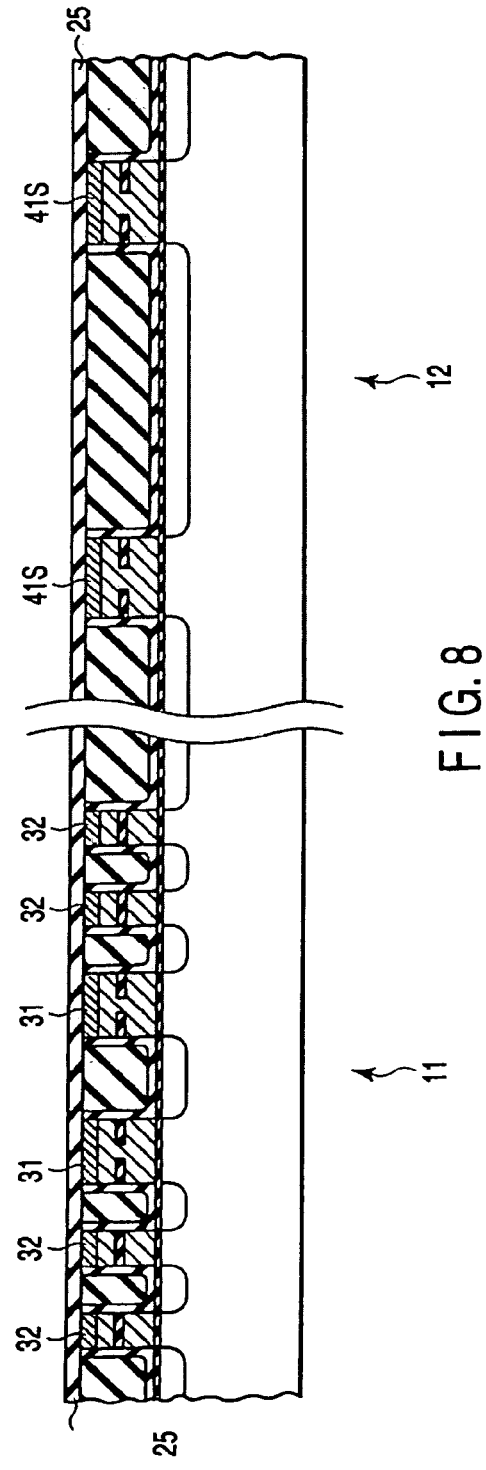

SEMICONDUCTOR DEVICE WITH DOUBLE BARRIER FILM

CROSS REFERENCE TO RELATED APPLICATIONS

This application is a Continuation of and is based upon and claims the benefit of priority under 35 U.S.C. §120 from U.S. Ser. No. 11/980,561, filed Oct. 31, 2007, which is a Continuation of U.S. Ser. No. 11/447,947, filed Jun. 7, 2006, now U.S. Pat. No. 7,291,875, issued Nov. 6, 2007, which is a Division of U.S. Ser. No. 11/001,223, filed Dec. 2, 2004, now U.S. Pat. No. 7,078,813, issued Jul. 18, 2006, and claims the benefit of priority under 35 U.S.C. § 119 from Japanese Patent Application No. 2004-282336, filed Sep. 28, 2004. The entire contents of each which are incorporated herein by reference.

BACKGROUND OF THE INVENTION

1. Field of the Invention

The present invention relates generally to a semiconductor device and a method of manufacturing the same, and is applied to, for example, a select transistor for selecting memory cell transistors having current paths connected in series in a NAND type flash memory.

2. Description of the Related Art

With ever increasing development in fine patterning of cells, there is a tendency that contacts for electrically connecting, e.g. diffusion layers of cells become still finer. Furthermore, with the progress of the generation of cells, it becomes difficult to carry out microfabrication of contacts by so-called lithography technology.

Jpn. Pat. Appln. KOKAI Publication No. 2002-118166, for instance, discloses a method wherein an etching mask film 13a, which has an opening pattern corresponding to a pattern of a diffusion layer 7 that serves as a source/drain, is formed on a first insulation film 11. Using the etching mask film 13a as a mask, the first insulation film 11 is etched down to a level of the surface of a silicide layer 8 that lies on the diffusion layer 7. Thus, a contact hole 14a is formed on the diffusion layer 7.

With this method, however, if the controllability of the etching step is inadequate, the silicide layer 8 on the diffusion layer 7 would be etched, or non-uniformity would occur in resistance value of the silicide layer 8 from cell to cell, due to a reaction between the silicide layer 8 and a gate insulation layer 2. Consequently, the reliability of the device deteriorates.

In addition, there is a tendency that the conventional structure, wherein the silicide layer 8 is provided on the diffusion layer 7, is disadvantageous for fine patterning for the following reasons (1) and (2).

(1) If the silicide layer 8 and gate insulation film 2 are provided close to each other, a substance (e.g. cobalt) in the silicide layer 8 would affect the film quality of the gate insulation film 2, and the insulation properties would deteriorate. Consequently, the reliability of the device would lower.

(2) The silicide layer 8 on the diffusion layer causes so-called junction leak.

In addition, the silicide layer 8 on the diffusion layer 7 reacts with the gate insulation film 2, thereby causing short-circuit between the silicide layer 8 and a gate electrode 6. As a result, the insulation properties would be degraded.

As has been described above, the conventional semiconductor device is disadvantageous for fine patterning, and the silicide layer on the diffusion layer reacts with the gate insulation film, thereby causing short-circuit between the silicide layer and gate electrode. Consequently, the insulation properties become poor and the reliability deteriorates.

Besides, in the method of manufacturing the conventional semiconductor device, if the controllability of the etching step is inadequate, the silicide layer on the diffusion layer would be etched, or non-uniformity would occur in resistance value of the silicide layer from cell to cell due to a reaction between the silicide layer and gate insulation layer. Consequently, the reliability of the device deteriorates.

BRIEF SUMMARY OF THE INVENTION

According to an aspect of the present invention, there is provided a semiconductor device comprising a gate insulated field-effect transistor having a gate electrode that is provided via a gate insulation film on a semiconductor substrate, a metal layer that is provided on the gate electrode, and diffusion layers that are separately provided in the semiconductor substrate such that the gate electrode is provided on a region lying between the diffusion layers, each of the diffusion layers serving as a source or a drain, a first barrier film that is provided on the diffusion layers and on side walls of the transistor, a first insulation layer that is provided on the first barrier film, a second barrier film that is continuously provided on the metal layer and on the first insulation layer, a trench that is opened in the second barrier film with a first width and extends in a first direction, a second insulation layer that is provided on the second barrier film, an upper contact hole portion that penetrates the second insulation layer and has a bottom in the second barrier film, the bottom having a second width greater than the first width in a second direction crossing the first direction, a lower contact hole portion that penetrates the first insulation layer and the first barrier film from the upper contact hole portion through the trench and is provided on the diffusion layer, an upper portion of the lower contact hole portion having the first width in the second direction, and a contact plug provided in the upper contact hole portion and the lower contact hole portion.

According to another aspect of the present invention, there is provided a semiconductor device comprising a memory cell row that is arranged in a first direction and includes a plurality of series-connected memory cell transistors having sources and drains shared, each of the plurality of memory cell transistors including, a floating electrode provided via a gate insulation film on a semiconductor substrate, an inter-gate insulation film provided on the floating electrode, and a control electrode provided on the inter-gate insulation film, select transistors that are arranged at both ends of the memory cell row and select the memory cell row, each of the select transistors including a gate electrode provided via the gate insulation film on the substrate, a metal layer that is provided on the control electrode and on the gate electrode, a first barrier film that is provided on diffusion layers, which are located between two the select transistors of different the memory cell rows that are adjacent in the first direction, and on opposed side surfaces of the two select transistors, a first insulation layer that is provided on the first barrier film, a second barrier film that is continuously provided on the metal layer and on the first insulation layer, a trench that is disposed between the two select transistors, includes an opening portion with a first width in the second barrier film, and extends in a second direction crossing the first direction, a second insulation layer that is provided on the second barrier film, an upper contact hole portion that penetrates the second insulation layer and has a bottom in the second barrier film, the bottom having a second width greater than the first width in the first direction, a lower contact hole portion that penetrates the first insulation layer and the first barrier film from the upper contact hole portion through the trench and is provided on the diffusion layer, and a contact plug provided in the upper contact hole portion and the lower contact hole portion.

According to still another aspect of the present invention, there is provided a semiconductor device comprising a transistor having a gate electrode that is provided via a gate insulation film on a semiconductor substrate, a metal layer that is provided on the gate electrode, and diffusion layers that are separately provided in the semiconductor substrate such that the gate electrode is sandwiched between the diffusion layers, each of the diffusion layers serving as a source or a drain, a first barrier film that is provided on the diffusion layer, which serves as the source or drain of the transistor, and on side walls of the transistor, a first insulation layer that is provided on the first barrier film, a second barrier film that is continuously provided on the metal layer and on the first insulation layer; a second insulation layer that is provided on the second barrier film, an opening portion that is provided in the second barrier film and is located over the diffusion layer, a first contact plug that continuously penetrates the second insulation layer, the first insulation layer and the first barrier layer through the opening portion, and is provided on the diffusion layer, and a second contact plug that continuously penetrates the second insulation layer, the second barrier film and the metal layer and establishes electrical connection to the gate electrode.

BRIEF DESCRIPTION OF THE SEVERAL VIEWS OF THE DRAWING

FIG. 7 is a cross-sectional structural view that schematically illustrates a fabrication step of the semiconductor device according to the first embodiment of the invention;

FIG. 8 is a cross-sectional structural view that schematically illustrates a fabrication step of the semiconductor device according to the first embodiment of the invention;

DETAILED DESCRIPTION OF THE INVENTION

Figure 1:
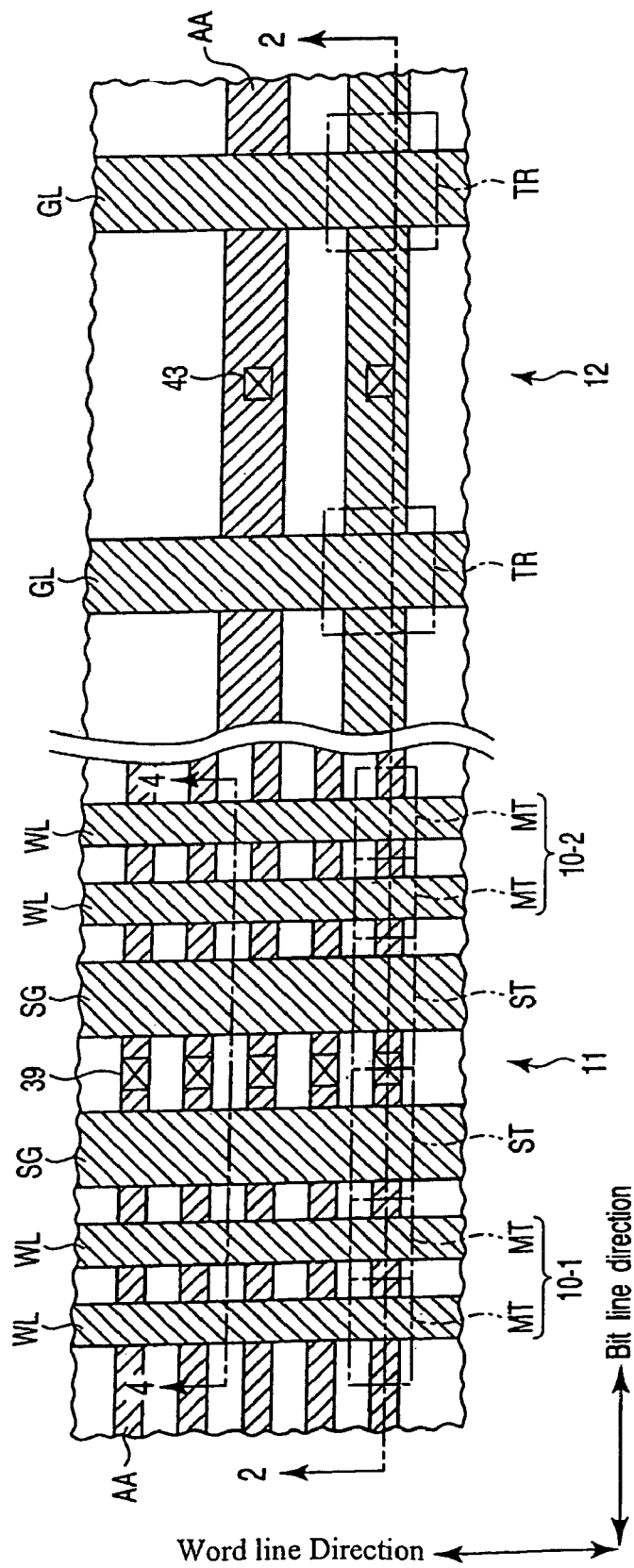
FIG. 1 is a plan view that schematically shows a semiconductor device according to a first embodiment of the present invention.

Embodiments of the present invention will now be described with reference to the accompanying drawings. In the description, common parts are denoted by like reference numerals throughout the drawings.

First Embodiment

<Structure>

The structure of a semiconductor device according to a first embodiment of the invention is described referring to FIG. 1 to FIG. 4.

Figure 2:
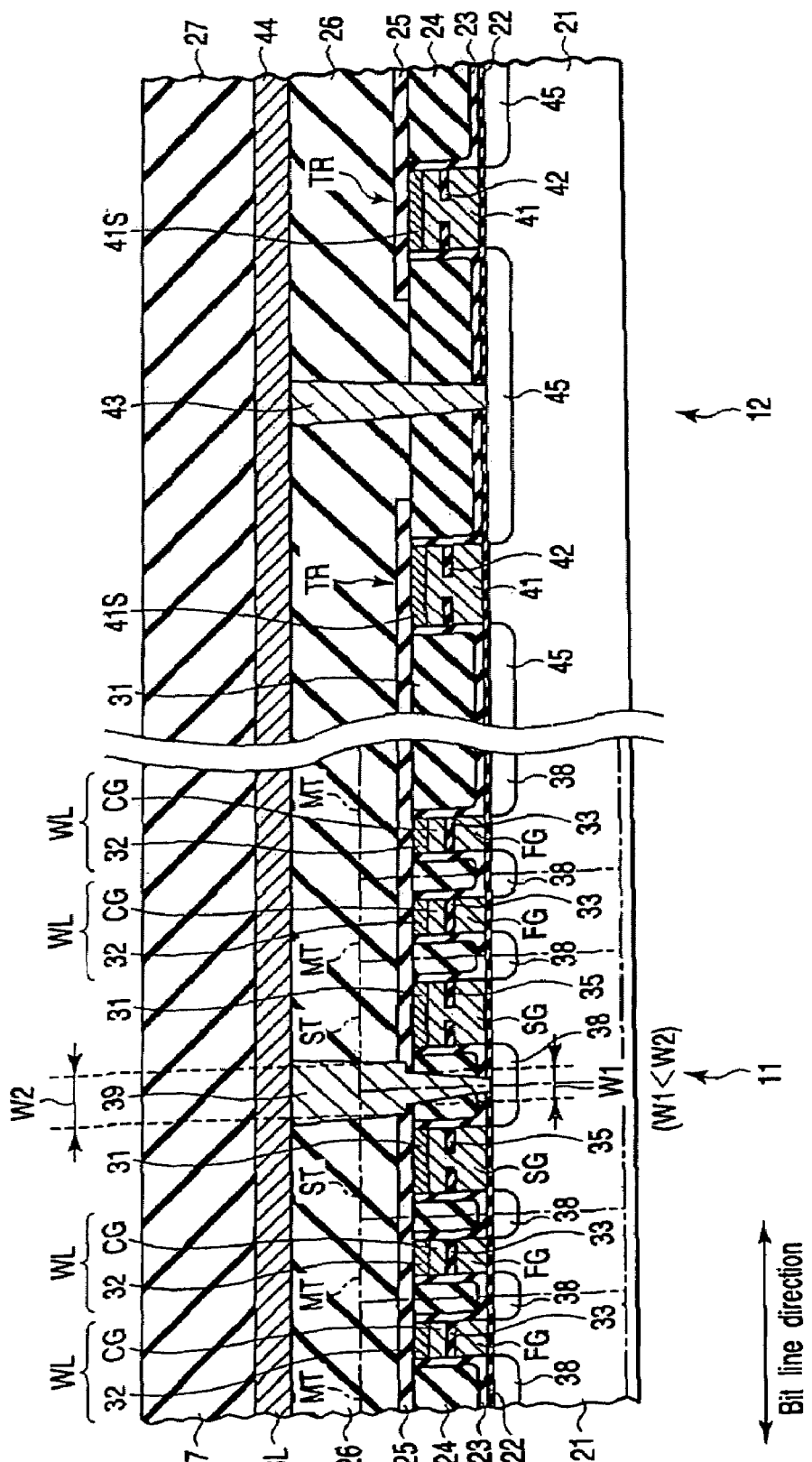
FIG. 2 is a cross-sectional structural view taken along line 2-2 in FIG. 1.

FIG. 1 is a plan view that schematically shows the semiconductor device according to the first embodiment. FIG. 2 is a cross-sectional structural view taken along line 2-2 in FIG.

Figure 3:
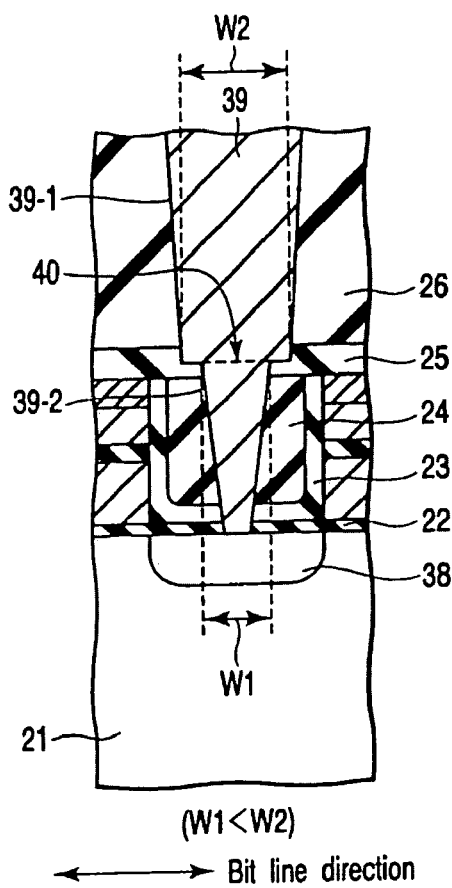
FIG. 3 is a cross-sectional structural view that shows, in enlarged scale, a contact near a barrier film 25 in FIG. 2.
Figure 4:
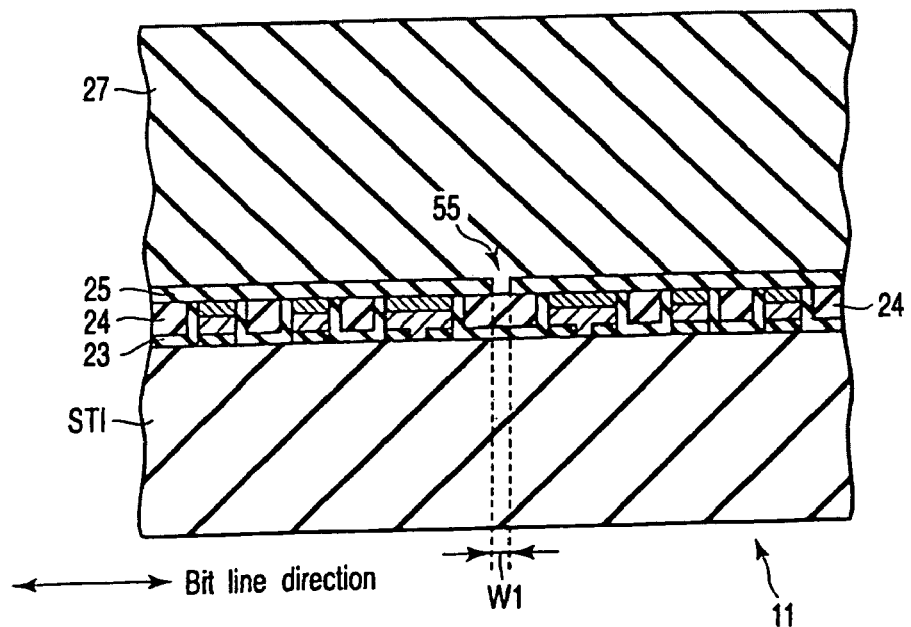
FIG. 4 is a cross-sectional structural view taken along line 4-4 in FIG. 1.

1. FIG. 3 is a cross-sectional structural view that shows, in enlarged scale, a contact plug 39 near a barrier film 25 in FIG. 2. FIG. 4 is a cross-sectional structural view taken along line 4-4 in FIG. 1. In this embodiment, a NAND type flash memory is described by way of example.

As is shown in the Figures, a memory cell array 11 and a peripheral circuit 12 are provided on a major surface of a semiconductor (silicon) substrate 21.

The memory cell array 11 includes memory cell rows 10-1 and 10-2 that are arranged in a bit line direction, and select transistors ST. The select transistors ST select memory cell rows 10-1 and 10-2.

The memory cell row 10-1, 10-2 includes a plurality of memory cell transistors MT. The memory cell transistors MT have their sources and drains shared and are connected in series.

In the memory cell array 11, device regions AA are provided in the bit line direction, and word lines WL and select gate electrodes SG are provided in a word line direction. Bit lines BL (not shown in FIG. 1) are provided on the device regions AA in the bit line direction. The select transistors ST are provided at intersections between the bit lines BL and select gate electrodes SG, and the memory cell transistors MT are provided at intersections between the bit lines BL and word lines WL.

In the peripheral circuit 12, device regions AA are provided in the bit line direction. Gate lines GL are provided in the word line direction. Bit lines BL (not shown in FIG. 1) are provided on the device regions AA in the bit line direction. Peripheral transistors TR are provided at intersections between the device regions AA and gate lines GL.

The peripheral transistor TR is, for instance, a so-called transfer transistor with a high withstand voltage, which transfers a write voltage to a control electrode CG of the memory cell transistor MT.

The select transistor (insulated gate field-effect transistor) ST comprises a gate insulation film 22 provided on the substrate 21; a select gate electrode SG provided on the gate insulation film 22; a silicide layer 31 provided on the select gate electrode SG; and diffusion layers 38 each serving as a source/drain, which are provided in the substrate 21 and separated so as to sandwich the select gate electrode SG. An insulation film 35 provided in the select gate electrode SG is separated at a central part of the select gate electrode SG such that upper and lower conductive parts of the select gate electrode SG are continuous.

The memory cell transistor MT comprises a floating electrode FG provided on the gate insulation film 22; an inter-gate insulation film 33 provided on the floating electrode FG; a control electrode CG that is provided on the inter-gate insulation film 33; a silicide layer 32 provided on the control electrode CG; and diffusion layers 38 each serving as a source/drain, which are provided in the substrate 21 and separated so as to sandwich the floating electrode FG. The word line WL has a stacked structure comprising the control electrode CG and silicide layer 32. The floating electrodes FG in the respective memory cell transistors MT are isolated from each other.

A barrier film (first barrier film) 23 is provided on side walls of the select transistor ST and memory cell transistor MT and on the diffusion layers 38. An insulation layer 24 (first insulation layer) is provided on the barrier film 23. A barrier layer (second barrier layer) 25 is provided on the silicide layers 31 and 32. An insulation layer 26 (second insulation layer) is provided on the barrier film 25. A bit line BL is provided on the insulation layer 26, and an insulation layer 27 is provided on the bit line BL.

In a case where the barrier films 23 and 25 are formed of, e.g. silicon nitride (SiN), the thickness of the barrier film 25 is greater than that of the barrier film 23. Preferably, the thickness of the barrier film 25 should be about twice or more greater than that of the barrier film 23.

The barrier films 23 and 25 function as barriers against diffusion of substances, such as ions or moisture, in the insulation layers 24 and 26, or against reactions between substances, such as cobalt silicon (CoSi), in the insulation layers 24 and 26 and the silicide layers (metal layers) 31, 32 and 41S.

Moreover, the barrier films 23 and 25 function as stoppers at a time of forming contact plugs 39.

As has been described above, the memory cell transistors MT are arranged adjacent to each other in the bit line direction and share the diffusion layers 38 that function as sources/drains. In addition, the memory cell transistors MT are provided such that their current paths are connected in series between the select transistors ST. The memory cell transistors MT are selected by the select transistors ST. The Figures omit depiction of the other select transistor that is to be connected to the current path of the memory cell transistors MT. The number of memory cell transistors MT, which are connected in series between the select transistors ST, may be any number of two or more, for example, 8, 16, or 32.

A contact plug 39 is provided on the diffusion layer (drain) 38 of the select transistor ST. The contact plug 39 penetrates the insulation layers 26 and 24, barrier films 25 and 23 and gate insulation film 22. The contact plug 39 electrically connects the diffusion layer 38 and the bit line BL.

As is shown in FIG. 3, the contact plug 39, as viewed in the direction of the bit line BL, is formed by filling a conductive layer of, e.g. a metal in an upper contact hole portion 39-1 and a lower contact hole portion 39-2. The upper contact hole portion 39-1 penetrates the insulation layer (second insulation layer) 26. A bottom 40 of the upper contact hole portion 39-1 is located in the barrier film (second barrier film) 25, and the bottom 40 has a width W2. An upper part of the lower contact hole portion 39-2 has a width W1 that is less than the width W2 (W1<W2). The lower contact hole portion 39-2 is provided on the diffusion layer 38, and extends downward from the bottom 40 of the upper contact hole portion 39-1 and penetrates the barrier film (second barrier film) 25, insulation layer (first insulation layer) 24, barrier film (first barrier film) 23 and gate insulation film 22. In other words, the contact plug 39 in the barrier film 25 has a stepwise cross-sectional shape with a wide upper part and a narrow lower part.

It is preferable that the width W2 of the contact plug 39 be about twice or more greater than the width W1 in the bit line direction. However, the width W2 may be still greater.

In general, as shown in the Figures, the width W1, W2 becomes narrower in the downward direction, and the width W1, W2 of the contact plug varies slightly in the depth direction. However, there arises no problem if the relationship, W1<W2, is satisfied. Part of the opening portion (with opening width W1) of the second barrier film 25 is etched back, thus forming an opening portion with the width W2 in the second barrier film 25.

If the selectivity ratio between the insulation layer 26 and barrier film 25 is small, it is likely an opening portion with a continuously varying width may be formed instead of the stepwise opening portion with widths W1 and W2 in the barrier film 25, as shown in the Figures.

In the etching step of forming the lower contact hole portion 39-2, there may be a case where the width of the lower contact hole portion 39-2 increases and does not agree with the width W1.

In the cross section of FIG. 4, however, the contact plug 39 is not provided and the width of the part in the barrier film 25 becomes W1 without fail.

The peripheral transistor TR comprises a gate insulation film 22 provided on the substrate 21; a gate line GL provided on the gate insulation film 22; and diffusion layers 45 each serving as a source/drain, which are provided in the substrate 21 and separated so as to sandwich the gate line GL. An insulation film 42 provided in the gate line GL is separated at a central part of the gate CG such that upper and lower conductive parts of the conductor layer 41 become continuous. A silicide layer 41S is provided on the conductor layer 41. It should suffice if the upper and lower conductive parts of the conductor layer 41 are electrically connected. For example, peripheral part of the insulation film 42 may be separated such that the upper and lower conductive parts of the conductor layer 41 are electrically connected.

A barrier film 23 is provided on side walls of the peripheral transistor TR and on the diffusion layers 45. An insulation layer 24 is provided on the barrier film 23. A barrier layer 25 is provided on the silicide layer 41S. An insulation layer 26 is provided on the barrier film 25. A wiring layer 44 is provided on the insulation layer 26, and an insulation layer 27 is provided on the wiring layer 44.

A contact 43, which penetrates the insulation layers 26 and 24, is provided on the diffusion layer 45 of the peripheral transistor TR. The contact 43 electrically connects the diffusion layer 45 and wiring layer 44.

As has been described above, in the semiconductor device according to the present embodiment, the barrier layer 25 is provided so as to cover the silicide layers 31, 32 and 41S. Thus, the barrier film 25 functions as a barrier against diffusion of substances, such as ions or moisture, in the insulation layers 24 and 26, or against reactions between substances, such as cobalt silicon (CoSi), in the insulation layers 24 and 26 and the silicide layers 31, 32 and 41S. Therefore, the reliability of the device can be enhanced.

The barrier film 23 is provided on the diffusion layers 38 and side walls of the select transistors ST and memory cell transistors MT. Thus, the barrier film 23 functions as a barrier against diffusion of substances in the insulation layers 24, or against reactions between substances in the insulation layers 24 and the silicide layers 31, 32 and 41S. Therefore, the reliability of the device can be enhanced.

No silicide layer is provided on the diffusion layer 38. Hence, so-called junction leak does not occur due to the silicide layer, and the silicide layer does not affect or degrade the insulation properties of the gate insulation film 23. Therefore, the reliability of the device can be enhanced. In addition to these advantageous effects, the cell area in the bit line direction can be decreased by a degree corresponding to the area that would be occupied if the silicide layer is provided, and fine patterning can advantageously be performed.

Moreover, the contact plug 39, as viewed in the direction of the bit line BL, is formed by filling a conductive layer of, e.g. a metal in the upper contact hole portion 39-1 and the lower contact hole portion 39-2. The upper contact hole portion 39-1 penetrates the insulation layer 26, and the bottom 40 with width W2 of the upper contact hole portion 39-1 is located in the barrier film 25. The upper part of the lower contact hole portion 39-2 has a width W1 that is less than the width W2 (W1<W2), and the lower contact hole portion 39-2 extends downward from the bottom 40 of the upper contact hole portion 39-1, penetrates the barrier film (second barrier film) 25, insulation layer (first insulation layer) 24, barrier film (first barrier film) 23 and gate insulation film 22, and reaches the diffusion layer 38.

Thus, the width W1 of the contact plug 39 is set at a small value, and the cell area in the bit line direction can be reduced while electrical contact with the diffusion layer 38 is secured. Therefore, this structure is advantageous for fine patterning. On the other hand, since the width W2 of the contact plug 39 is set at a large value, it is possible to reduce the resistance value of the contact plug 39.

It is preferable that the width W2 be about twice or more greater than the width W1 in the bit line direction. However, the width W2 may be still greater. In the case where the width W2 is about twice or more greater than the width W1, the resistance value of the contact plug 39 can be reduced.

According to the above-described structure of the contact plug 39, the width of the lower contact hole portion 39-2 can be reduced even where the aspect ratio between the insulation layer 26 and insulation layer 24 is large. Therefore, a contact between fine-patterned cells can advantageously be formed.

<Manufacturing Method>

Referring to FIG. 5 to FIG. 14, a description is given of the method of manufacturing the semiconductor device according to the present embodiment, taking the NAND type flash memory shown in FIG. 1 or FIG. 2 by way of example.

Figure 5:
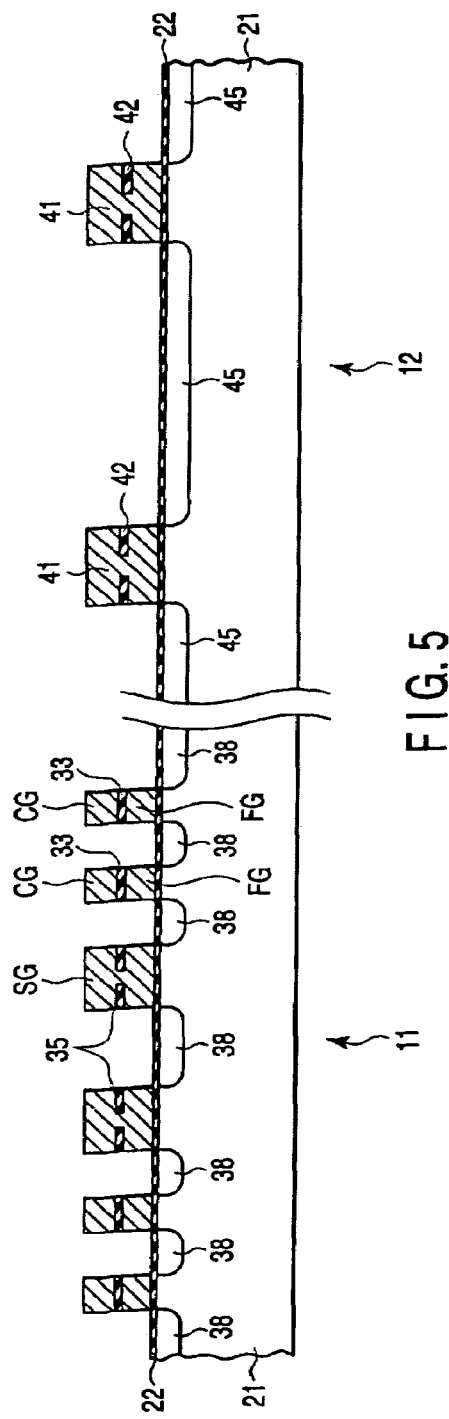
FIG. 5 is a cross-sectional structural view that schematically illustrates a fabrication step of the semiconductor device according to the first embodiment of the invention.

To start with, using a well-known fabrication step, as illustrated in FIG. 5, a gate insulation film 22, a select gate electrode SG, an insulation layer 35, a floating electrode FG, an inter-gate insulation film 33, a control electrode CG and diffusion layers 38 are formed on a major surface region of the substrate 21 that becomes the memory cell array 11.

At the same time, using a well-known fabrication step, a gate insulation film 22, a conductive layer 41, an insulation layer 42 and diffusion layers 45 are formed on a major surface region of the substrate 21 that becomes the peripheral circuit 12.

Figure 6:
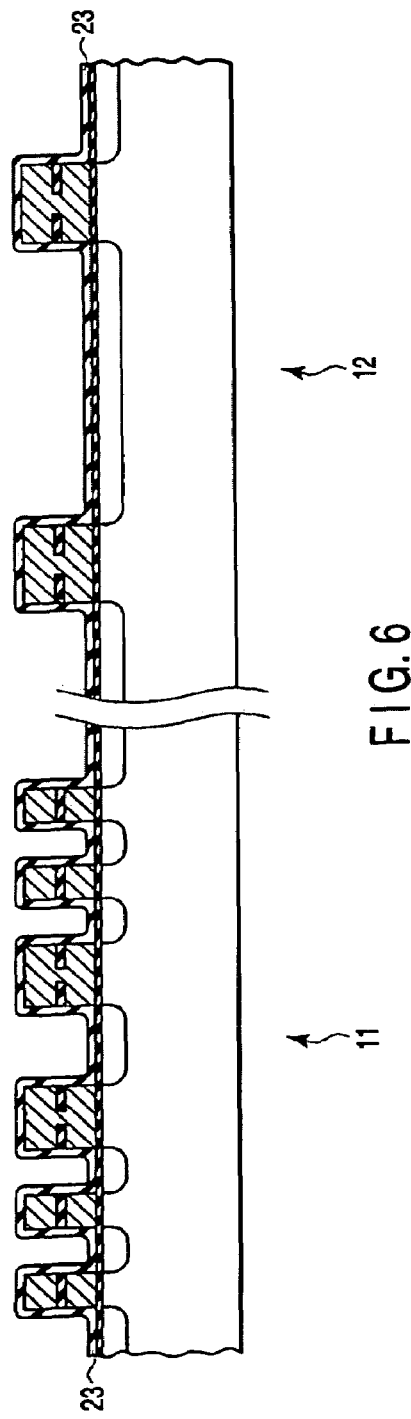
FIG. 6 is a cross-sectional structural view that schematically illustrates a fabrication step of the semiconductor device according to the first embodiment of the invention.

Subsequently, as shown in FIG. 6, a barrier film (first barrier film) 23 is formed by depositing a silicon nitride (SiN) film, for instance, by CVD (Chemical Vapor Deposition), over the gate insulation film 22, select gate electrode SG, control electrode CG and conductive layer 41.

In FIG. 7, an insulation layer 24 is deposited by, e.g. CVD, on the barrier film 23. The insulation layer 24 and barrier layer 23 are planarized by, e.g. CMP (Chemical Mechanical Polishing) at a level of the surfaces of the select gate electrode SG, control electrode CG and conductive layer 41. Thus, the barrier film 23 is left on the side walls of the select gate electrode SG, control gate CG and conductive layer 41 and on the diffusion layers 38 and 45.

Then, as shown in FIG. 8, the select gate electrode SG, control electrode CG and conductive layer 41 are reacted with a high-melting-point metal layer by a salicide (self-aligned silicide) process, thereby forming silicide layers 31, 32 and 41S. Thereafter, a barrier film (second barrier film) 25 is formed by depositing, e.g. a silicon nitride film by, e.g. CVD on the silicide layers 31, 32 and 41S, the insulation 24 and the barrier film 23.

In the salicide process, what is to be reacted with the select gate electrode SG, control electrode CG and conductive layer 41 is not limited to the high-melting-point metal layer. The silicide layers 31, 32 and 41S can be formed by reacting the select gate electrode SG, control electrode CG and conductive layer 41 with a metal layer of, e.g. cobalt (Co) or nickel (Ni), which does not fall into the category of high-melting-point metals and can form a silicide layer.

In the step of forming the barrier film 25, there is a possible case where the barrier films 23 and 25 are formed of the same material. In this case, it is preferable to make the thickness of the barrier film 25 greater than that of the barrier film 23 (e.g. twice or more) by selecting, for example, conditions for reactions.

Figure 9:
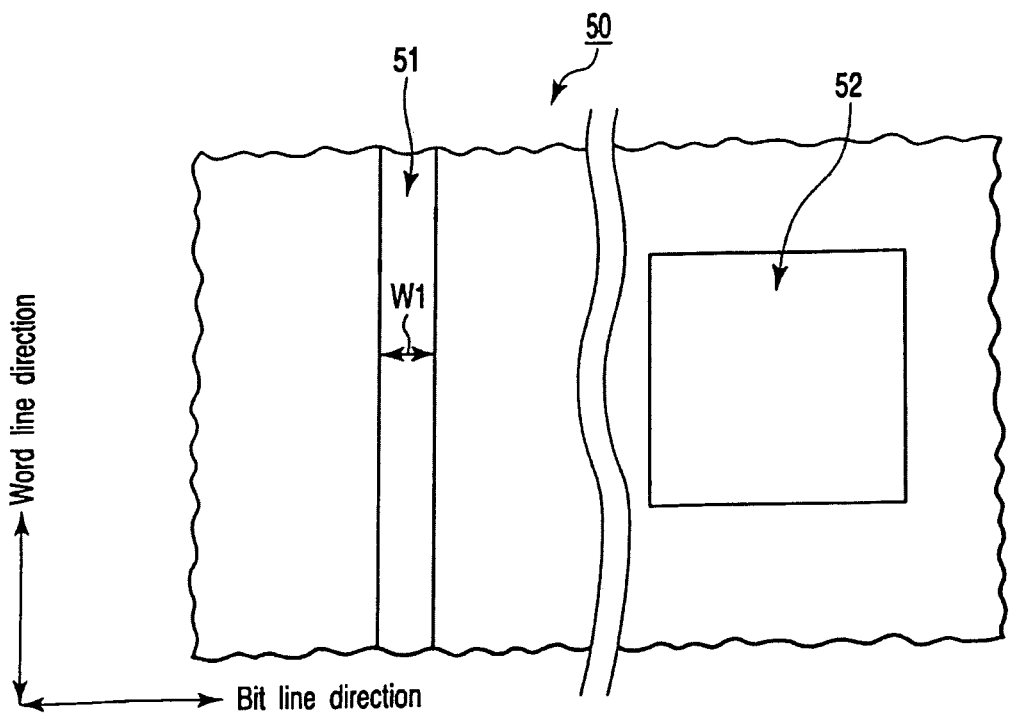
FIG. 9 is a plan view that schematically shows a photoresist for use in a fabrication step of the semiconductor device according to the first embodiment of the invention.
Figure 10:
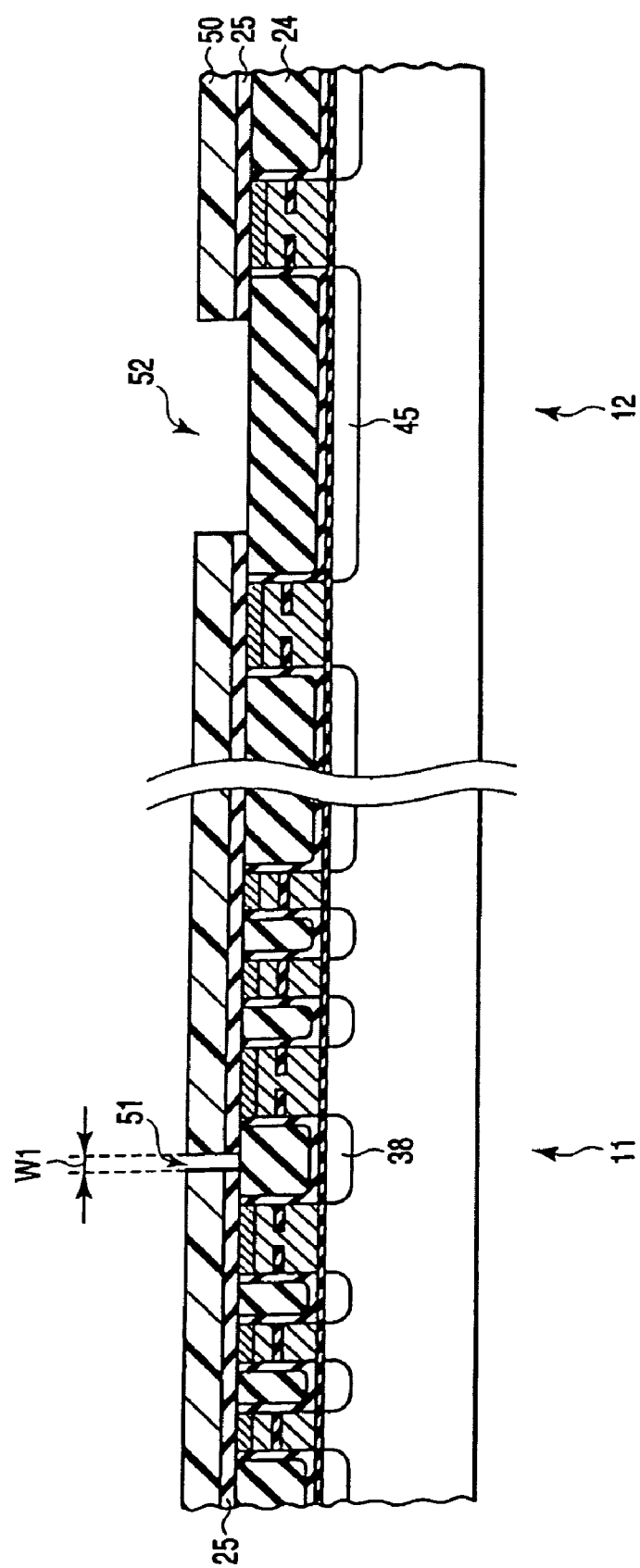
FIG. 10 is a cross-sectional structural view that schematically illustrates a fabrication step of the semiconductor device according to the first embodiment of the invention.

Subsequently, as shown in FIG. 9 and FIG. 10, a photoresist is coated on the barrier film 25. The photoresist is subjected to exposure and development, and a pattern as shown in FIG. 9 is transferred. Thus, a photoresist 50 is formed. In the region of the memory cell array 11, the photoresist 50 has a trench (opening portion) 51 with a width W1 in the word line direction on the diffusion layer 38. On the other hand, in the region of the peripheral circuit 12, the photoresist 50 has an opening portion 52 on the diffusion layer 45.

Alternatively, the photoresist may be replaced with a hard mask.

Using the photoresist 50 with the transferred pattern as a mask, anisotropic etching by, e.g. RIE (Reactive Ion Etching), is effected, at least, to a level of the surface of the insulation layer 24, and thus the barrier film 25 is etched away. Then, the photoresist 50 is removed.

Figure 11:
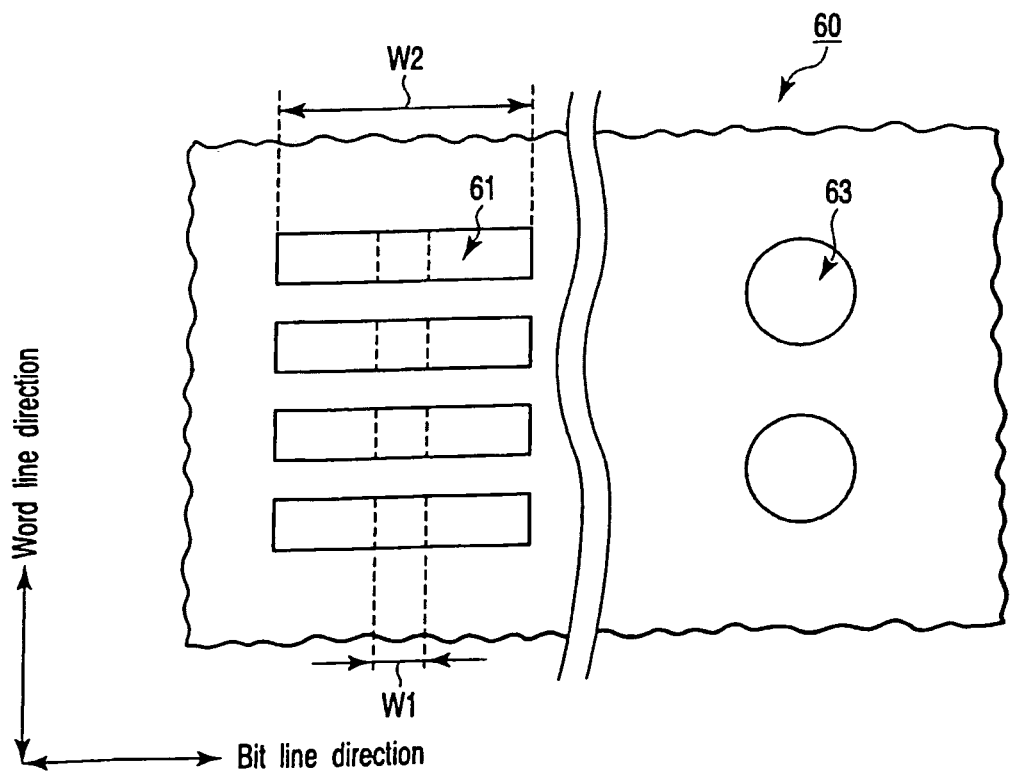
FIG. 11 is a plan view that schematically shows a photoresist for use in a fabrication step of the semiconductor device according to the first embodiment of the invention.
Figure 12:
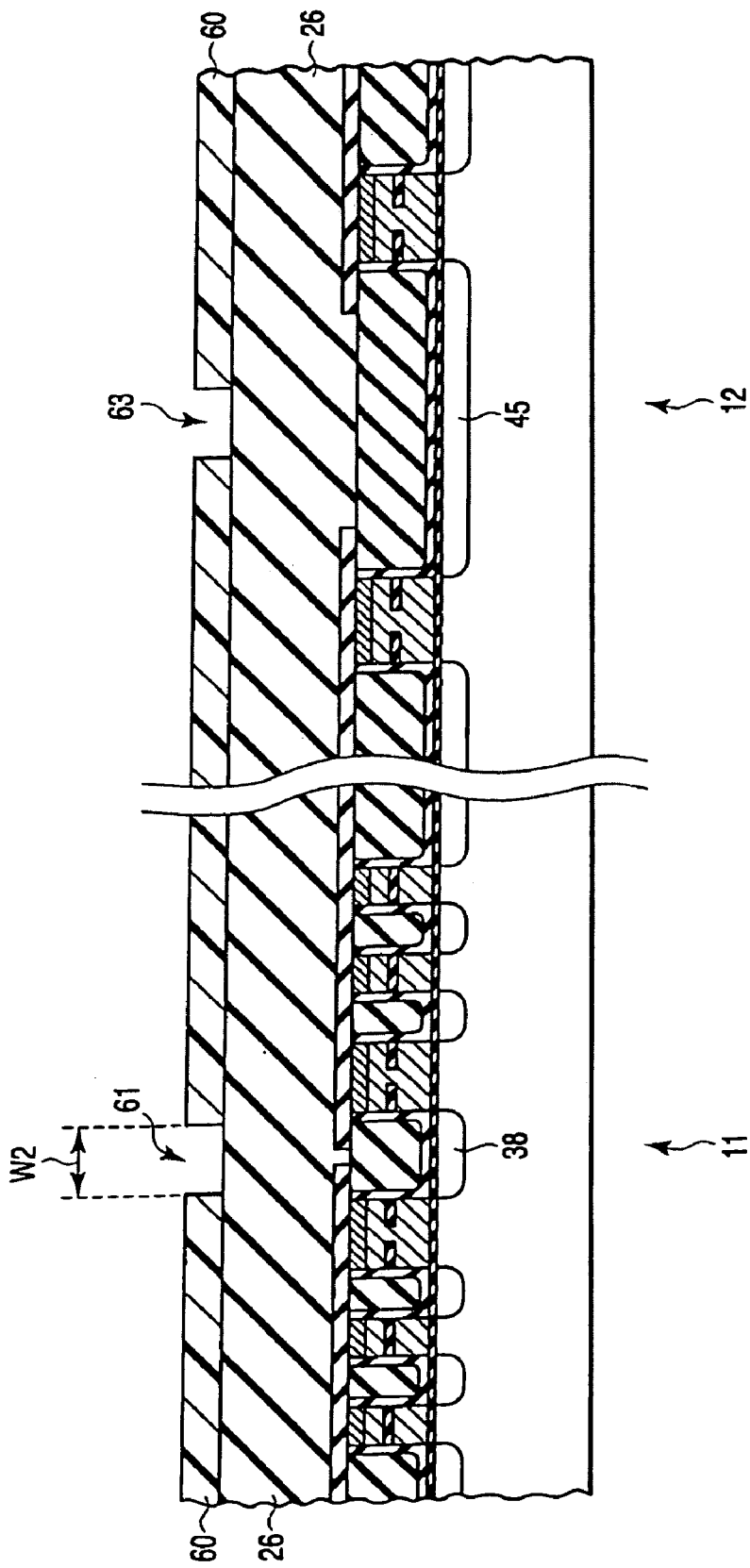
FIG. 12 is a cross-sectional structural view that schematically illustrates a fabrication step of the semiconductor device according to the first embodiment of the invention.

Following the above step, as shown in FIG. 11 and FIG. 12, an insulation layer 26 is formed by, e.g. CVD on the insulation layer 24 and barrier film 25. Thereafter, a photoresist is coated on the insulation layer 26. Further, the photoresist is subjected to exposure and development, and a pattern as shown in FIG. 11 is transferred to form a photoresist 60.

The photoresist 60 includes opening portions 61 each with a width W2 that is greater than the width W1 along the word line direction on the diffusion layers 38 in the region of the memory cell array 11. The photoresist 60 includes opening portions 63 on the diffusion layers 45 in the region of the peripheral circuit 12. The diameter of the opening portion 63 is less than the width of the opening 52 formed in the photoresist 50.

Figure 13:
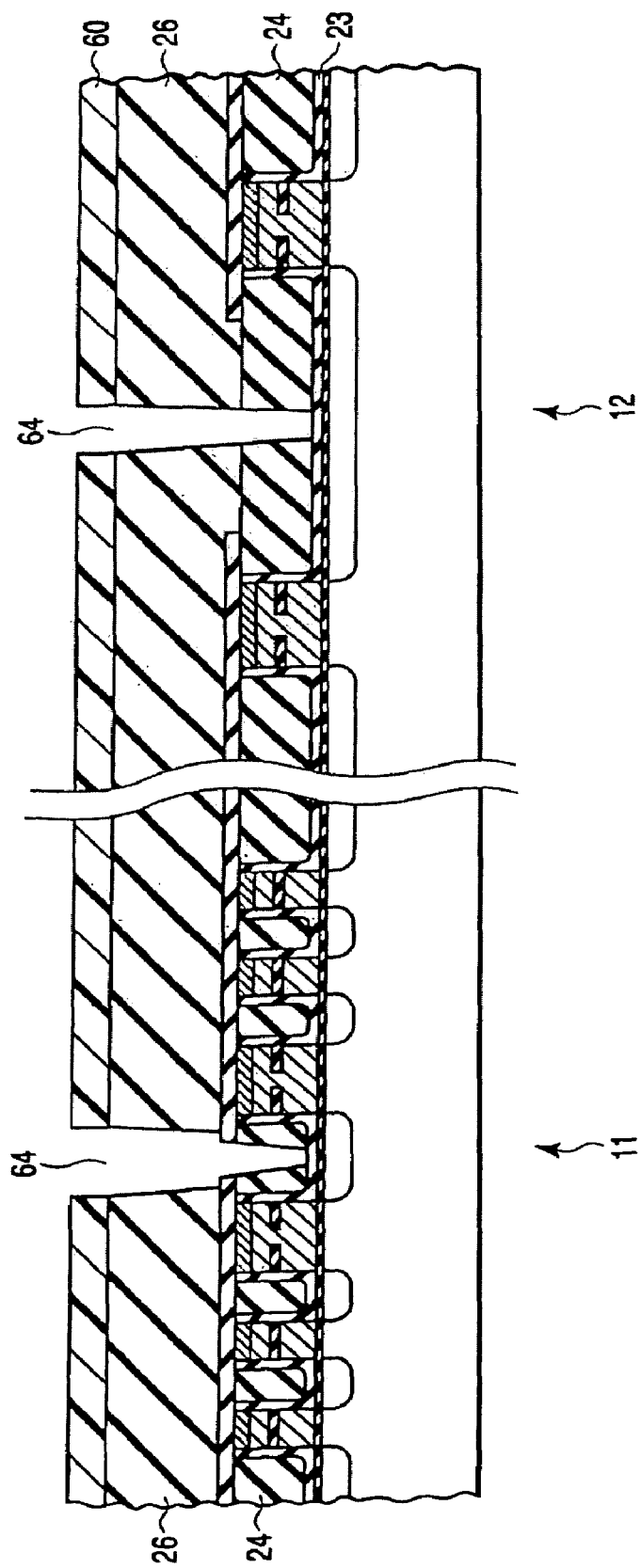
FIG. 13 is a cross-sectional structural view that schematically illustrates a fabrication step of the semiconductor device according to the first embodiment of the invention.

Then, as shown in FIG. 13, using the photoresist 60 with the transferred pattern as a mask, anisotropic etching with a selectivity ratio for the insulation layer 23 is performed by, e.g. RIE, down to a level of the surface of the barrier film 23, 25. Thus, contract holes that penetrate the insulation layers 26 and 24 are formed.

Figure 14:
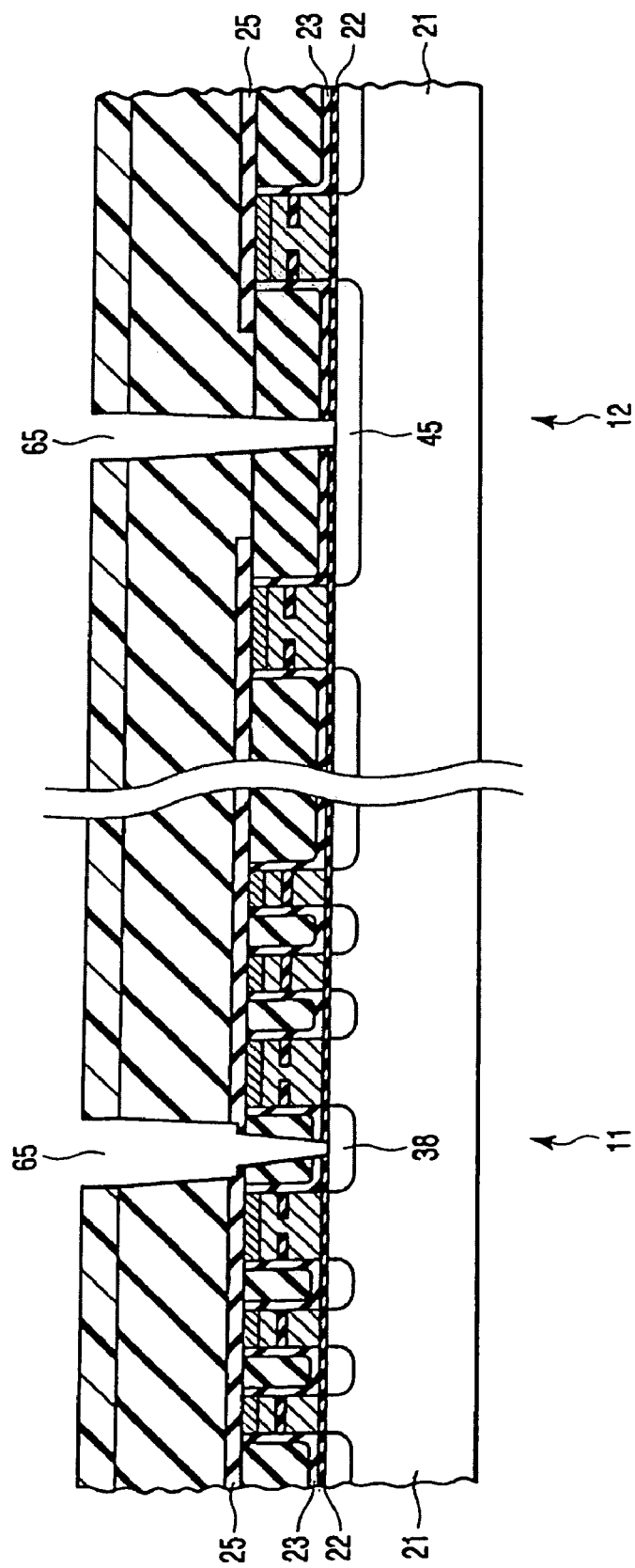
FIG. 14 is a cross-sectional structural view that schematically illustrates a fabrication step of the semiconductor device according to the first embodiment of the invention.

Further, as shown in FIG. 14, using the photoresist 60 as a mask, anisotropic etching by, e.g. RIE is performed until the surface of the substrate 21 on the diffusion layers 45 and 38 is exposed. Thus, contact holes, which penetrate the gate insulation film 22 and barrier film 23 and are shaped such that a part of the barrier film 25 is etched back, are formed. In other words, anisotropic etching is performed using the photoresist 60 as a mask, and an upper contact hole portion 39-1 having a bottom with the width W2 in the barrier film 25 is formed using the barrier film 25 as a stopper. In addition, etching is further progressed from the position of the trench 51 (opening portion), thereby forming a lower contact hole portion 39-2 that penetrates the barrier film 23 and gate insulation film 22, has the width W1 in the barrier film 25, and has a depth reaching the diffusion layer 38.

The contact hole 65 is filled with a metal such as copper (Cu), aluminum (Al) or tungsten (W), and polysilicon (Poly-Si), and a contact plug 39 is formed.

As has been described above, in the anisotropic etching step for forming the upper contact hole portion 39-1, a part of the barrier film 25 is etched back and thus the upper contact hole portion 39-1 with the opening width W2 is formed.

Using well-known subsequent steps, the bit line BL and insulation layer 27 are formed, and the semiconductor device shown in FIG. 1 or FIG. 2 is manufactured.

According to the above-described method of manufacturing the semiconductor device of the present embodiment, the photoresist (mask layer) 60 having the opening portion with width W2 greater than width W1 is used as a mask, and the barrier film 25 having the opening portion with width W1 is used as a stopper layer. Thereby, the insulation layers 26 and 24 are subjected to anisotropic etching, and the upper contact hole portion 39-1 and lower contact hole portion 39-2 are formed (FIG. 13 and FIG. 14).

By setting the width W2 of the opening portion at a large value, the etching rate of the insulation layer 26 can be increased and a large selectivity ratio to the barrier film 25 can be set. Accordingly, the barrier film 25 can be used as a stopper, and a fine contact with a width substantially equal to the width W1 of the opening portion in the barrier layer 25 can be formed in the insulation layer 24.

Further, in the above-described step, a part of the barrier layer 25, which has a greater thickness than the barrier film 23, can be etched back by selecting time, etc. This prevents occurrence of such a phenomenon that the barrier film 25 is excessively etched and the contact plug 39 and select gate electrode SG are short-circuited. Therefore, the reliability of the device can be enhanced.

In this embodiment, the barrier layers 23 and 25 are formed of the same material. Alternatively, the barrier films 23 and 25 may be formed of different materials. In this case, too, the same advantageous effects can be obtained by selecting conditions relating to time, reactions, etc. in the above-described steps.

The photoresist 50, which is used as a mask, has the trench 51 with width W1 along the bit line direction on the diffusion layer 38 in the region of the memory cell array 11 and has the opening portion 52 on the diffusion layer 45 in the region of the peripheral circuit 12. Using this mask, anisotropic etching by, e.g. RIE is performed down to the level of the surface of the insulation layer 24, and the barrier film 25 is etched away (FIG. 9, FIG. 10).

In the above-described step, the barrier film 25 in the region of the memory cell array 11 and the region of the peripheral circuit 12 can be removed at a time in accordance with the trench 51 and opening 52 in the photoresist 50. Therefore, the manufacturing cost can advantageously be reduced.

Furthermore, the photoresist 60, which is used as a mask, has the opening portion 61 with width W2 greater than width W1 along the bit line direction on the diffusion layer 38 in the region of the memory cell array 11 and has the opening portion 63 on the diffusion layer 45 in the region of the peripheral circuit 12. Using this mask, anisotropic etching is performed. Thus, the contact holes 64 that penetrate the insulation layers 26 and 24 are formed (FIG. 11 to FIG. 13).

In the above-described step, contact holes 64 can be formed at a time in the insulation layers 26 and 24 of the memory cell array 11 and peripheral circuit 12. Therefore, the manufacturing cost can advantageously be reduced.

In the present embodiment, the contact holes 64 and 65 are formed at a time in the memory cell array 11 and peripheral circuit 12. Alternatively, the contact holes 64 and 65 can be formed independently in the memory cell array 11 and peripheral circuit 12.

[Modification 1 (Modification of Etching Mask)]

Figure 15:
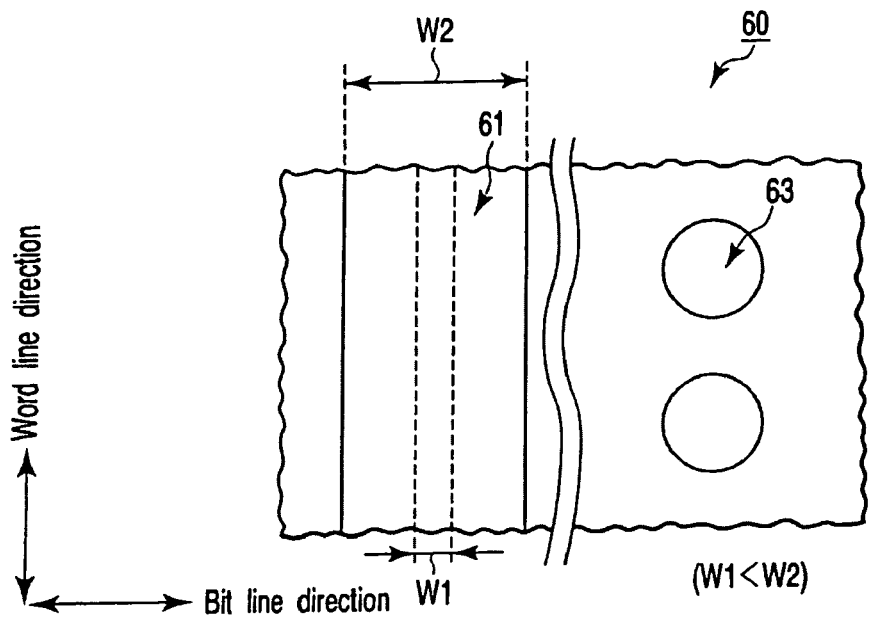
FIG. 15 is a plan view that schematically shows a photoresist for use in a fabrication step of a semiconductor device according to Modification 1 of the invention.
Figure 16:
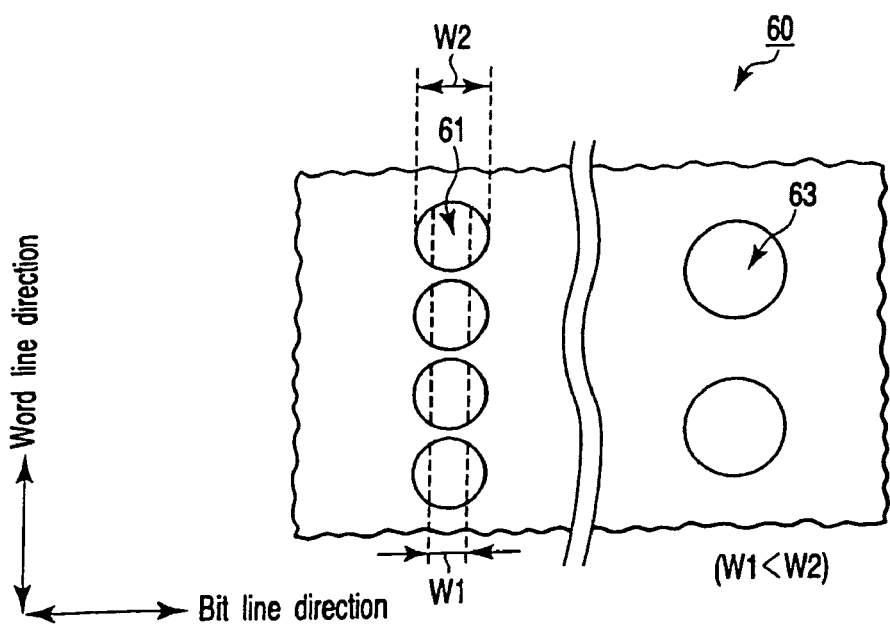
FIG. 16 is a plan view that schematically shows a photoresist for use in a fabrication step of the semiconductor device according to Modification 1 of the invention.

A method of manufacturing a semiconductor device according to Modification 1 of the present invention will now be described with reference to FIG. 15 and FIG. 16. Modification 1 relates to the photoresist 60 in the above-described first embodiment. FIG. 15 and FIG. 16 are plan views that schematically show a photoresist 60 for use in the manufacturing method of the semiconductor device according to Modification 1. A description of the parts common to those of the first embodiment is omitted.

A photoresist 60 shown in FIG. 15 has a trench 61 that is formed in the word line direction with a width W2 greater than the width W1. With this photoresist 60, a so-called common source line is formed, wherein the diffusion layers 38 of the select transistors ST arranged along the word line direction cab be set at an equal potential.

A photomask 60 shown in FIG. 16 has circular opening portions 61 each having a diameter W2 that is greater than the width W1. With this photoresist 60, like the first embodiment, drain contacts, which are separated in association with the respective diffusion layers 38 of the select transistors ST in the bit line direction, are formed.

With each of the photoresists shown in FIG. 15 and FIG. 16, the same cross-sectional structure as shown in FIG. 2 is obtained.

With the manufacturing method of the semiconductor device according to Modification 1, the same advantageous effects as with the first embodiment can be obtained. Furthermore, the common source line can be formed by anisotropic etching using, as a mask, the photoresist 60 having the trench 61 that is formed in the word line direction with the width W2 greater than the width W1 (FIG. 15).

Hence, the common source line can be formed without increasing the number of masks, and the manufacturing cost can advantageously be reduced.

Besides, the drain contacts can be formed by anisotropic etching using, as a mask, the photoresist 60 having the circular opening portions 61 with the diameter W2 greater than the width W1 (FIG. 16). Since the circular opening portion 61 may have the same shape as the opening portion 63 in the peripheral circuit, the manufacturing cost can advantageously be reduced.

[Modification 2 (Modification of Peripheral Circuit)]

Figure 17:
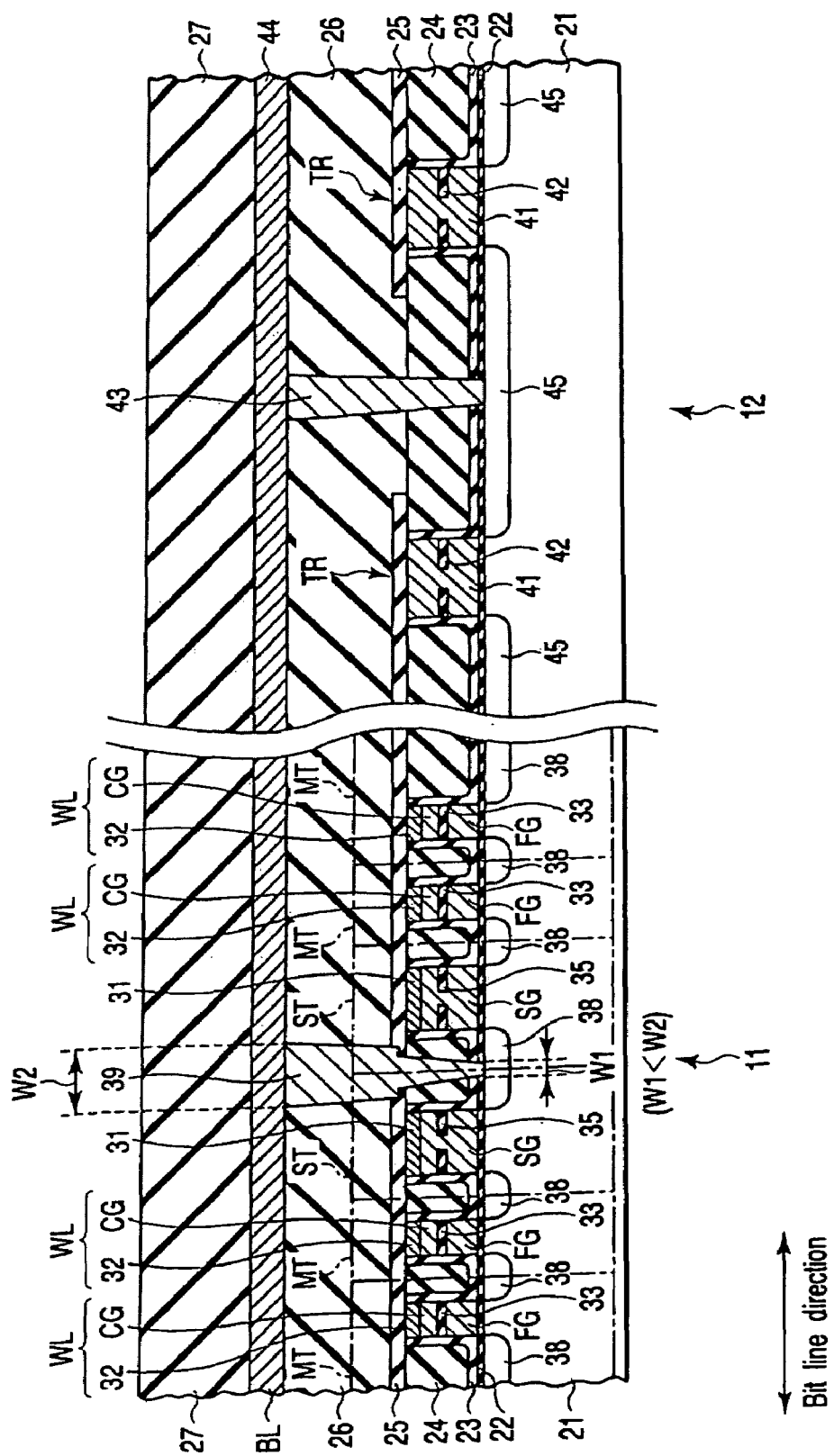
FIG. 17 is a cross-sectional view that schematically shows the structure of a semiconductor device according to Modification 2 of the invention.
Figure 18:
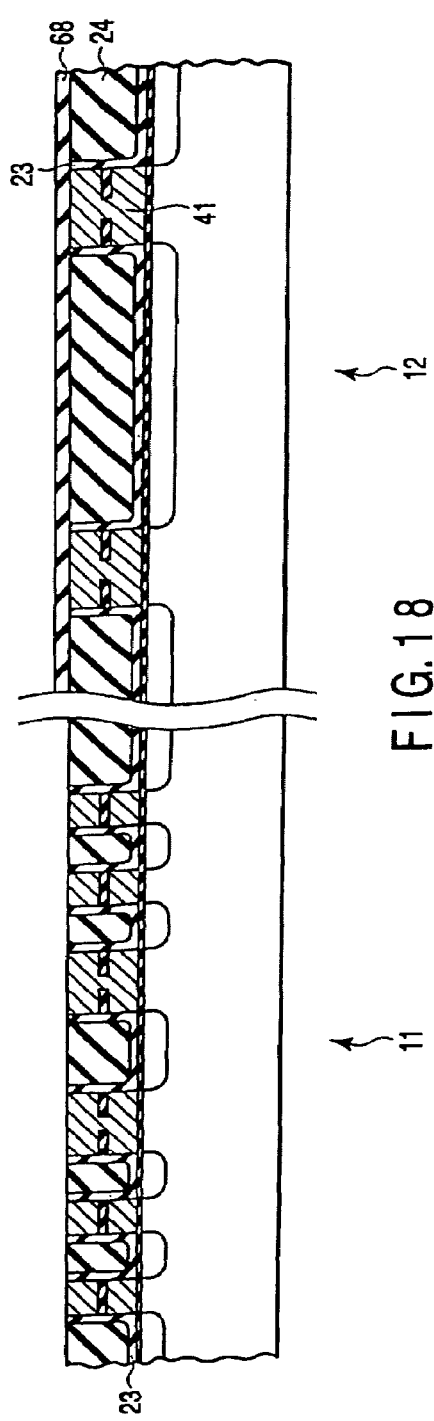
FIG. 18 is a cross-sectional structural view that schematically illustrates a fabrication step of the semiconductor device according to Modification 2 of the invention.
Figure 19:
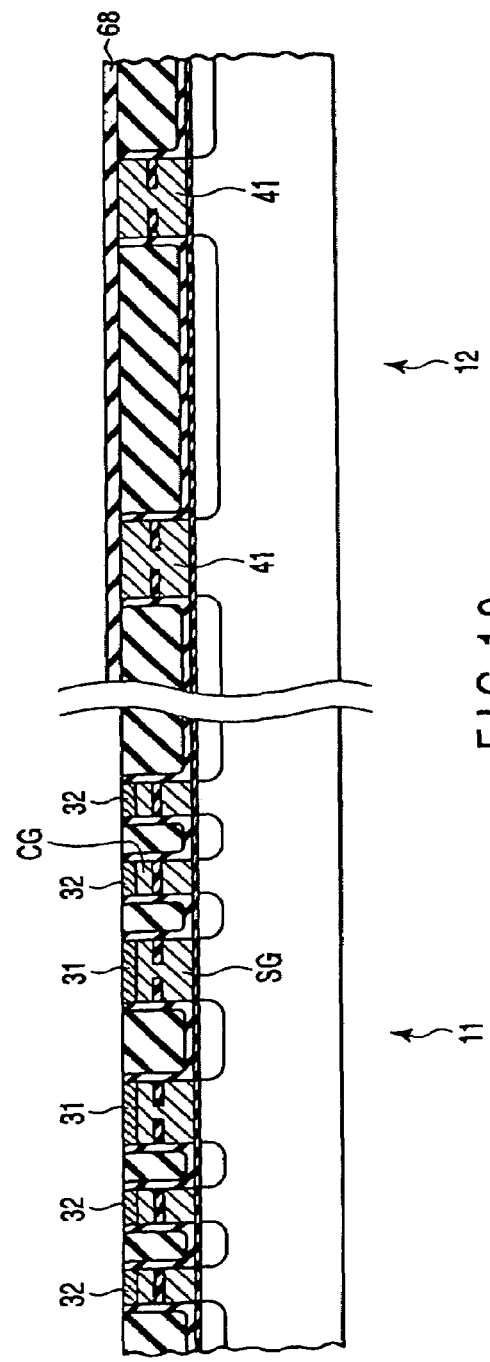
FIG. 19 is a cross-sectional structural view that schematically illustrates a fabrication step of the semiconductor device according to Modification 2 of the invention.

A method of manufacturing a semiconductor device according to Modification 2 of the present invention will now be described with reference to FIG. 17 through FIG. 19. FIG. 17 is a cross-sectional view that schematically shows the structure of a semiconductor device according to Modification 2. FIG. 18 and FIG. 19 are cross-sectional structural views that schematically illustrate fabrication steps of the semiconductor device according to Modification 2. Modification 2 relates to the gate line GL of the peripheral circuit 12 in the first embodiment. A description of the parts common to those in the first embodiment is omitted.

According to the semiconductor device of Modification 2, the same advantageous effects as with the first embodiment are obtained. In addition, as shown in the Figures, the gate line GL of the peripheral transistor TR of the peripheral circuit 12 is not provided with a silicide layer. Thus, the selectivity relating to the gate structures between the memory cell array 11 and the peripheral circuit 12 can advantageously be enhanced.

A manufacturing method of the semiconductor device according to Modification 2 is described. To start with, using the same fabrication steps as in the first embodiment, the gate structures of the memory cell array 11 and peripheral circuit 12 are formed.

Then, as illustrated in FIG. 18, a barrier film 23 of, e.g. silicon nitride (SiN) is formed by, e.g. CVD on the insulation layer 24, barrier film 23 and conductor layer 41 of the peripheral circuit 12 alone.

Thereafter, a salicide process is executed to react the select gate electrode SG and control electrode CG with a high-melting-point metal layer, thereby forming silicide layers 31 and 32. In this step, the barrier film 68 formed on the conductive layer 41 of the peripheral circuit 12 prevents a reaction between the conductive layer 41 and the high-melting-point metal.

Through the same subsequent fabrication steps, the semiconductor device as shown in FIG. 17 is manufactured.

As has been described above, according to the manufacturing method of the semiconductor device relating to Modification 2, the same advantageous effects as with the first embodiment are obtained. In addition, with the barrier film 68 formed on the conductive layer 41 of the peripheral circuit 12, the salicide process is executed to form the silicide layers 31 and 32 only in the memory cell array 11. Hence, the conductive layer 41 does not react with the high-melting-point metal, and the formation of a silicide layer can selectively be prevented in the peripheral circuit and the selectivity can advantageously be enhanced.

Second Embodiment (Dual Damascene Interconnect Structure)

Figure 20:
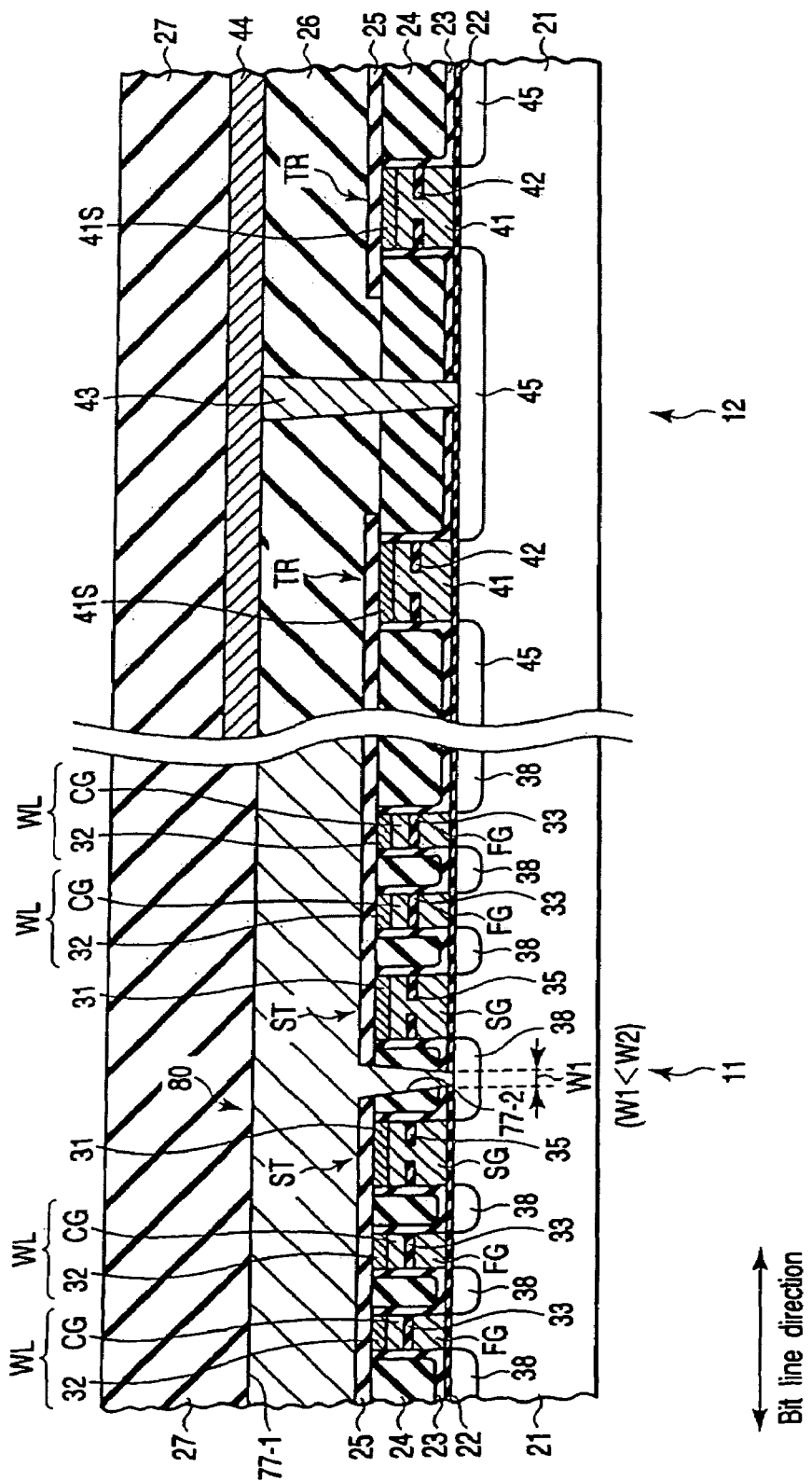
FIG. 20 is a cross-sectional structural view that schematically shows the structure of a semiconductor device according to a second embodiment of the invention.

A semiconductor device according to a second embodiment of the present invention and a method of manufacturing the semiconductor device will now be described with reference to FIG. 20 through FIG. 23. FIG. 20 is a cross-sectional view that schematically shows the structure of the semiconductor device according to the second embodiment. In the second embodiment, the contact plug 39 of the first embodiment is formed with a so-called dual damascene interconnect structure. A description of the parts common to those in the first embodiment is omitted.

As is shown in FIG. 20, a dual damascene interconnect layer 80 is provided. The dual damascene interconnect layer 80 is formed by continuously filling the same conductor in a contact hole 77-2, which penetrates the barrier films 25 and 23, insulation layer 24 and gate insulation film 22 and is provided on the diffusion layer 38, and in a trench 77-1, which penetrates the insulation layer 26 and has a bottom on the barrier film 25. The conductor buried in the trench 77-1 functions as an interconnect for electrical connection in the bit line BL direction and for application of a predetermined potential and supply of a predetermined current. The conductor buried in the contact hole 77-2 functions as a contact for electrical connection to the diffusion layer 38.

As has been described above, with the semiconductor device according to the second embodiment, the same advantageous effect as with the first embodiment can be obtained. In addition, The dual damascene interconnect layer 80 is formed by continuously filling the same conductor in the contact hole 77-2, which penetrates the barrier films 25 and 23, insulation layer 24 and gate insulation film 22 and is provided on the diffusion layer 38, and in the trench 77-1, which penetrates the insulation layer 26 and has its bottom on the barrier film 25. Therefore, the memory cell array 11 can be formed with a multi-layer structure, and finer patterning can advantageously be performed.

Figure 21:
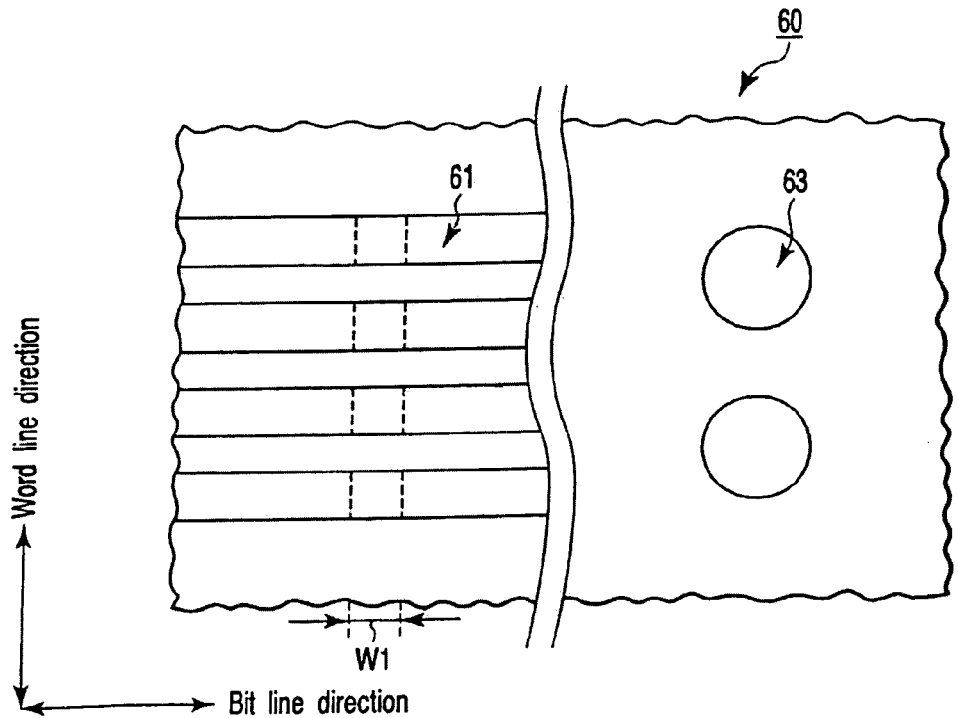
FIG. 21 is a plan view that schematically shows a photoresist for use in a fabrication step of the semiconductor device according to the second embodiment of the invention.
Figure 22:
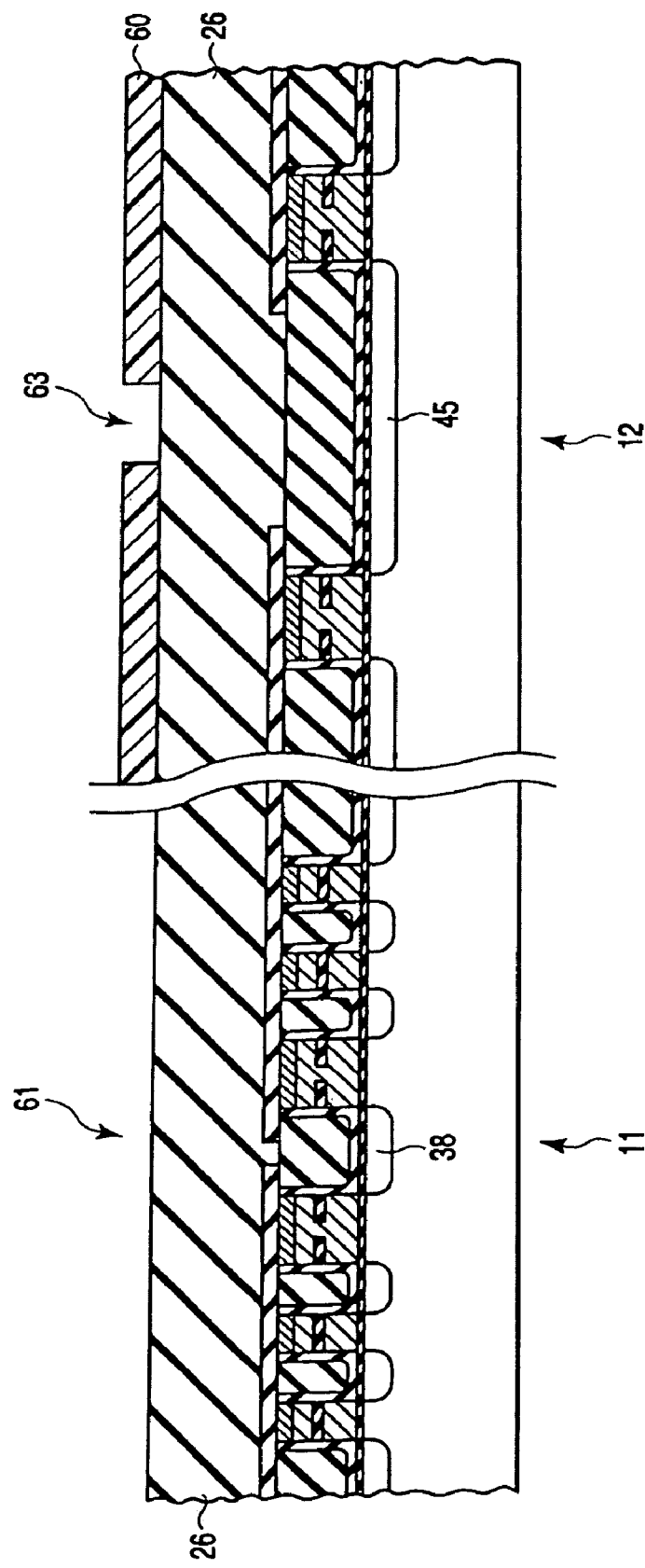
FIG. 22 is a cross-sectional structural view that schematically illustrates a fabrication step of the semiconductor device according to the second embodiment of the invention.
Figure 23:
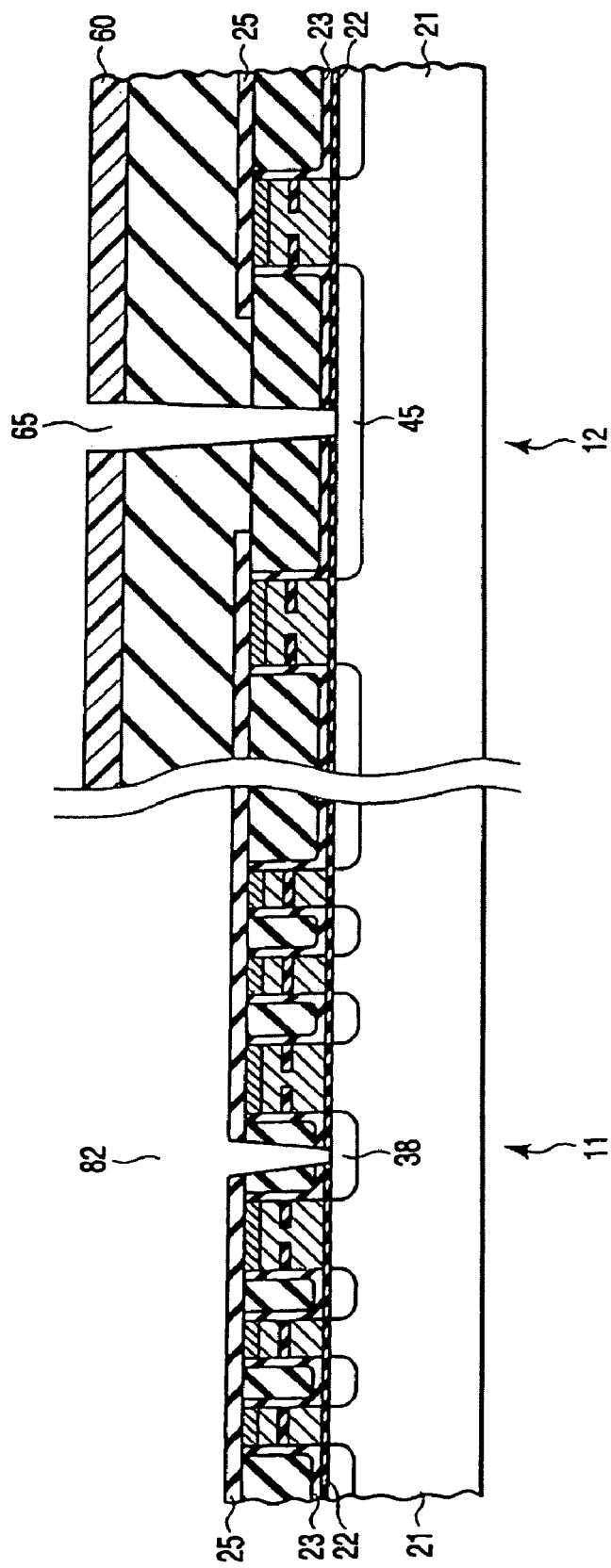
FIG. 23 is a cross-sectional structural view that schematically illustrates a fabrication step of the semiconductor device according to the second embodiment of the invention.

Next, a manufacturing method of the semiconductor device according to the second embodiment is described referring to FIG. 21 to FIG. 23.

To start with, as shown in FIG. 22, through the same fabrication steps as in the first embodiment, the insulation layer 26 is formed in the regions of the memory cell array 11 and peripheral circuit 12.

Then, a photoresist is coated on the insulation layer 26, and the photoresist is subjected to exposure and development. Thus, a photoresist 60 with a transferred pattern, as shown in FIG. 21, is formed. The photoresist 60, as shown in FIG. 21, has trenches 61 on the diffusion layer 38 along the bit line direction.

Using the photoresist 60 as a mask, as illustrated in FIG. 23, anisotropic etching by, e.g. RIE is executed down to a level of the surface of the substrate 21, using the barrier film 25 as a stopper layer. Thus, a trench 82 and a contact hole 65 are formed.

Subsequently, through the same fabrication steps as in the first embodiment, the semiconductor device shown in FIG. 20 is manufactured.

According to this manufacturing method, the same advantageous effects as with the first embodiment can be obtained. In addition, anisotropic etching is performed using, as a mask, the photoresist 60 having the trenches 61 on the diffusion layers 38 along the bit line direction. Thereby, the trench 82 and contact hole 65 are formed (FIG. 21 to FIG. 23). Since the trenches 61 formed in the photoresist 60 are a so-called line-and-space pattern along the bit line direction, the manufacturing cost can be reduced and fine patterning can advantageously be performed.

Third Embodiment

A semiconductor device according to a third embodiment of the present invention and a method of manufacturing the semiconductor device will now be described with reference to FIG. 24 through FIG. 30. A description of the parts common to those in the first embodiment is omitted.

Figure 24:
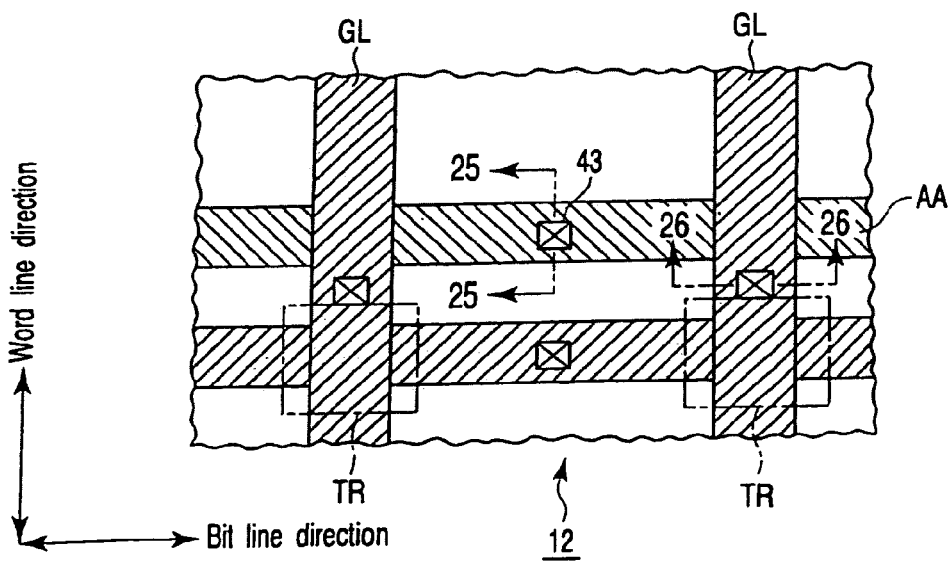
FIG. 24 is a plan view that schematically shows a semiconductor device according to a third embodiment of the present invention.
Figure 25:
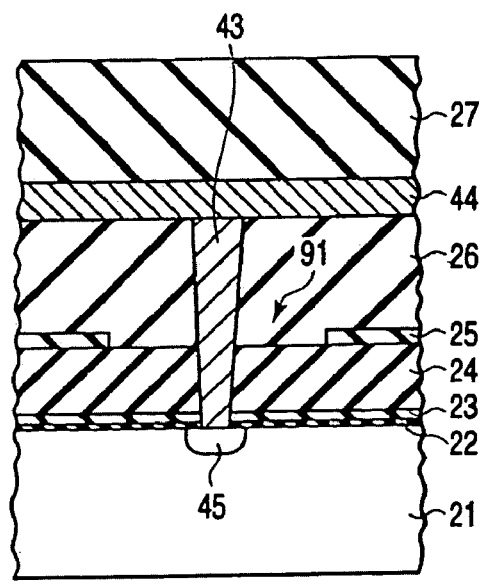
FIG. 25 is a cross-sectional structural view taken along line 25-25 in FIG. 24.
Figure 26:
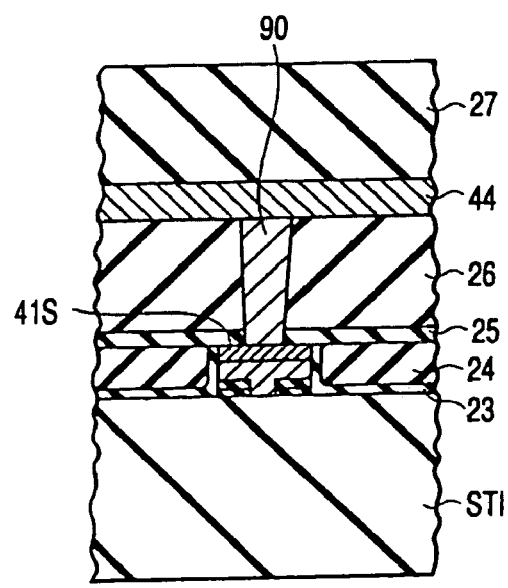
FIG. 26 is a cross-sectional structural view taken along line 26-26 in FIG. 24.

FIG. 24 is a plan view that schematically shows the semiconductor device according to the third embodiment. FIG. 25 is a cross-sectional structural view taken along line 25-25 in FIG. 24, and FIG. 26 is a cross-sectional structural view taken along line 26-26 in FIG. 24.

As is shown in the Figures, an opening portion 91 is provided on the diffusion layer 45 so as to penetrate the barrier film 25. In addition, a contact plug 43 (first contact plug) is provided on the diffusion layer 45 so as to continuously penetrate the opening portion 91, insulation layers 26 and 24, barrier film 23 and gate insulation film 22.

In addition, a contact plug 90 (second contact plug) is provided on a silicide layer 41S over a device isolation region STI so as to continuously penetrate the insulation layer 26 and barrier film 25. The contact plug 90 electrically connects the gate electrode and the wiring layer 44.

With the above-described structure, the same advantageous effects as with the first embodiment can be obtained.

Next, a description is given of the method of manufacturing the semiconductor device according to the present embodiment, taking the semiconductor device shown in FIG. 25 or FIG. 26 by way of example.

Figure 27:
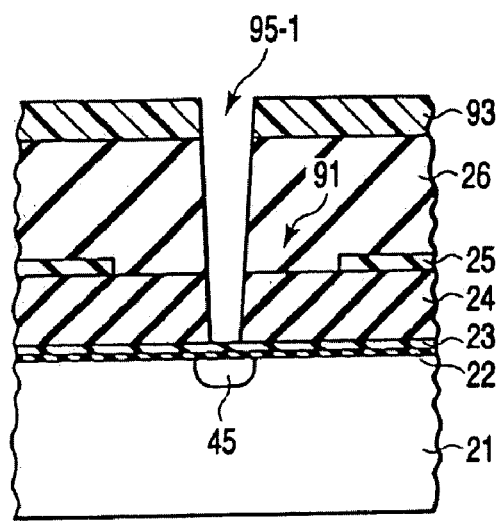
FIG. 27 is a cross-sectional structural view that schematically illustrates a fabrication step of the semiconductor device according to the third embodiment of the invention.
Figure 28:
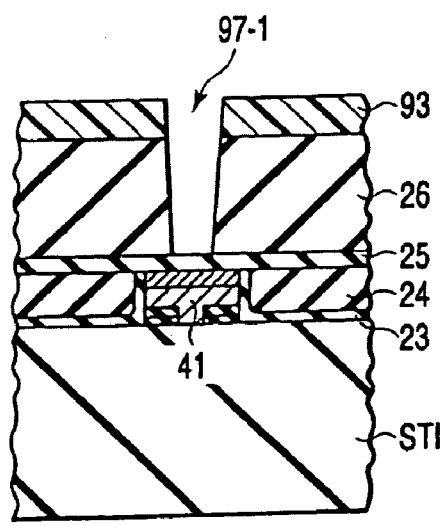
FIG. 28 is a cross-sectional structural view that schematically illustrates a fabrication step of the semiconductor device according to the third embodiment of the invention.

To start with, as illustrate in FIG. 27 and FIG. 28, through the same fabrication steps as described above, an opening portion 91 is formed in the barrier film 25 such that the opening portion 91 is located on the diffusion layer 45, and an insulation layer 26 is formed on the barrier film 25 and insulation film 24.

A photoresist 93 is coated on the insulation film 26, and the photoresist 93 is subjected to exposure and development. Thus, opening portions are formed in the photoresist at positions over the diffusion layer 45 and gate electrode 41.

Using the photoresist 93 as a mask, anisotropic etching by, e.g. RIE is performed. Thereby, a contact hole 95-1, which penetrates the insulation layers 26 and 23, is formed using the barrier film 23 as a stopper. At the same time, a contact hole 97-1, which penetrates the barrier film 26, is formed using the barrier film 25 as a stopper.

Figure 29:
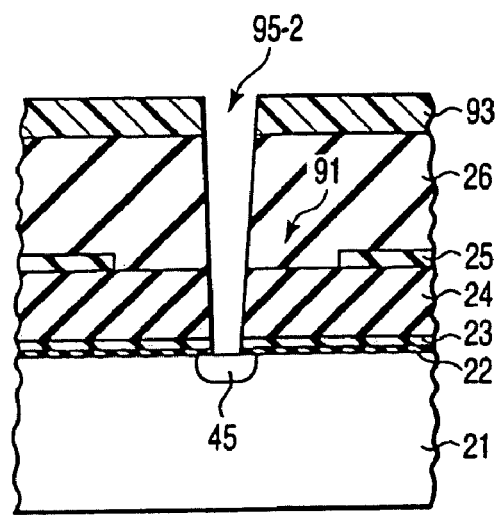
FIG. 29 is a cross-sectional structural view that schematically illustrates a fabrication step of the semiconductor device according to the third embodiment of the invention.
Figure 30:
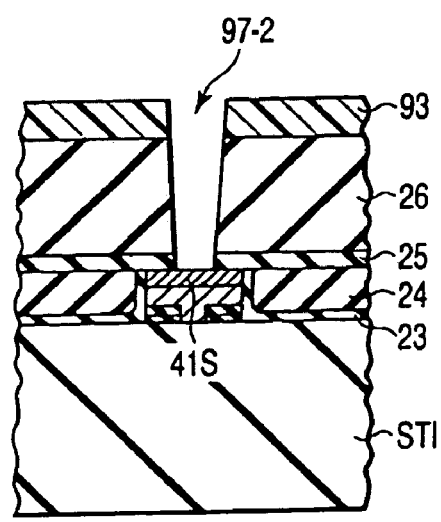
FIG. 30 is a cross-sectional structural view that schematically illustrates a fabrication step of the semiconductor device according to the third embodiment of the invention.

Then, as illustrated in FIG. 29 and FIG. 30, anisotropic etching is performed using the photoresist 93 as a mask, thereby forming a contact hole 95-2 that penetrates the barrier film 23 and gate insulation film 22 and is located on the diffusion layer 45, and a contact hole 97-2, which penetrates the barrier film 25 and is located on the silicide layer 41S.

Subsequently, using the well-known fabrication steps, the semiconductor device shown in FIG. 25 and FIG. 26 is manufactured.

According to the above-described manufacturing method, it is possible to simultaneously form the contact 43 on the diffusion layer 45 located on the device region AA and the contact 90 on the gate electrode (GC) located on the STI.

Therefore, the number of fabrication steps and the manufacturing cost can advantageously be reduced.

The opening portion 91 with a wide dimension is formed in the barrier film 25 on the device region AA in the step of the anisotropic etching (contact etching), while no opening is formed in the barrier film 25 on the STI. The barrier film 25 with no opening on the STI is used as a stopper in the subsequent anisotropic etching step. Thus, if the contact etching step is executed, the contact hole 97-1 on the STI stops at the barrier film 25, and the contact hole 95-1 on the device region AA stops at the barrier film 23 (FIG. 27, FIG. 28). In the subsequent barrier film etching, openings are formed at the same time in the barrier film 23 and barrier film 25, and contact holes 95-2 and 97-2 are simultaneously formed (FIG. 29, FIG. 30).

Since the contact holes 95-2 and 97-2 on the device region and STI can be formed using the same etching step, the number of fabrication steps can advantageously be reduced.

In addition, in the second etching step, the thin barrier films 23 and 25 are simultaneously etched and opened. Thus, such problems as short-circuit due to over-etching can be prevented, and the reliability is enhanced.

The silicide layer (metal layer) 41S shown in the cross section of this embodiment may be or may not be provided.

In this embodiment, the peripheral circuit 12 is described by way of example. However, this invention is applicable not only to the peripheral circuit, but also to all cases of contact formation.

In the first to third embodiments and Modifications 1 and 2, the peripheral circuit 12 is described by way of example. However, this invention is applicable to various peripheral circuits, for example, a peripheral circuit wherein diffusion layers 45 of adjacent peripheral transistors TR are not connected and are independently provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising: a semiconductor substrate including an active area; a gate insulating film formed on the semiconductor substrate in the active area; a gate electrode formed on the gate insulating film, the gate electrode including an upper surface and a first side surface; an insulator formed above the gate electrode; a wiring layer formed on the insulator; a contact plug formed on the semiconductor substrate in the active area and located adjacent to the gate electrode, the contact plug including a first portion having a second side surface facing to the first side surface of the gate electrode and a second portion located in the second insulator, the first portion contacted to the semiconductor substrate, the second portion having a third side surface contacted to the wiring layer; a first silicon nitride film formed between the second side surface of the contact plug and the first side surface of the gate electrode; and a second silicon nitride film formed between the upper surface of the gate electrode and the insulator, and formed above the first silicon nitride film.

2. The semiconductor device according to claim 1, wherein the gate electrode includes a silicide layer formed at an upper portion thereof.

3. The semiconductor device according to claim 1, wherein the insulator includes a silicon oxide film.

4. The semiconductor device according to claim 1, wherein the first portion of the contact plug includes a first diameter and the second portion of the contact plug includes a second diameter which is larger than the first diameter.

5. The semiconductor device according to claim 1, wherein the first silicon nitride film is contacted to the first side surface of the gate electrode.

6. The semiconductor device according to claim 1, wherein the second silicon nitride film is contacted to the upper surface of the gate electrode.

7. The semiconductor device according to claim 1, further comprising an insulation layer located between the second side surface of the contact plug and the first silicon nitride film.

8. The semiconductor device according to claim 1, wherein the second silicon nitride film is contacted to the contact plug.

9. The semiconductor device according to claim 1, wherein a first angle between an upper surface of the semiconductor substrate and the second side surface of the contact plug is smaller than a second angle between the upper surface of the semiconductor substrate and the third side surface of the contact plug.

10. A semiconductor device including a memory cell transistor, a first select gate transistor, and a second select gate transistor, comprising:
a semiconductor substrate including an active area extending to a predetermined direction;
a first gate electrode of the memory cell transistor formed above the semiconductor substrate in the active area, the first gate electrode including a first side surface;
a second gate electrode of the first select gate transistor formed above the semiconductor substrate in the active area, the second gate electrode including a pair of second side surfaces, one of the second side surfaces facing to the first side surface of the first gate electrode;
a third gate electrode of the second select gate transistor formed above the semiconductor substrate in the active area, the third gate electrode including a pair of third side surfaces, one of the third side surfaces facing to the other of the second side surfaces of the second gate electrode;
a silicon oxide film formed above the first, second, and third gate electrodes;
a bit line formed on the second silicon oxide film, the bit line extending to the predetermined direction;
a contact plug located between the second and third gate electrodes, the contact plug electrically connecting the active area of the semiconductor substrate and the bit line, the contact plug including a first portion having a fourth side surface facing to the second and third side surfaces of the second and third gate electrodes and a second portion having a fifth side surface contacted to the silicon oxide film;
a first silicon nitride film located between the fourth side surface of the contact plug and the second side surface of the second gate electrode and between the fourth side surface and the third side surface of the third gate electrode; and
a second silicon nitride film located between the silicon oxide film and upper surfaces of the first, second, third gate electrodes and the first silicon nitride film.

11. The semiconductor device according to claim 10, wherein the first portion of the contact plug includes a first diameter and the second portion of the contact plug includes a second diameter which is larger than the first diameter.

12. The semiconductor device according to claim 10, wherein the first silicon nitride film is contacted to the second and third side surfaces of the second and third gate electrodes.

13. The semiconductor device according to claim 10, wherein the second silicon nitride film is contacted to the upper surfaces of the first, second, and third gate electrodes.

14. The semiconductor device according to claim 10, further comprising an additional silicon oxide film located between the fourth side surface of the contact plug and the second side surface of the second gate electrode and located between the fourth side surface and the third side surface of the third gate electrode.

15. The semiconductor device according to claim 10, wherein the contact plug is contacted to the second silicon nitride film.

16. The semiconductor device according to claim 10, wherein the first gate electrode of the memory cell transistor includes a floating gate portion, an inter-gate insulating film formed on the floating gate portion and a control gate portion formed on the inter-gate insulating film.

17. The semiconductor device according to claim 10, wherein the each of the second and third gate electrodes of the second and third select gate transistors includes a lower gate portion, an inter-gate insulating film formed on the lower gate portion and an upper gate portion formed on the inter-gate insulating film, the inter-gate insulating film includes an opening and the upper gate portion is contacted to the lower gate portion through the opening, respectively.

18. The semiconductor device according to claim 16, wherein the control gate portion of the first gate electrode includes a silicide layer at the upper end thereof.

19. The semiconductor device according to claim 18, wherein the silicide layer includes one of cobalt or nickel.

20. The semiconductor device according to claim 16, wherein the upper portions of the second and third gate electrodes include a silicide layer at the upper end thereof, respectively.

21. The semiconductor device according to claim 20, wherein the silicide layer includes one of cobalt or nickel.

22. The semiconductor device according to claim 10, wherein a first angle between an upper surface of the semiconductor substrate and the fourth side surface of the contact plug is smaller than a second angle between the upper surface of the semiconductor substrate and the fifth side surface of the contact plug.

* * * * *